US011037885B2

(12) United States Patent
Chien et al.

(10) Patent No.: US 11,037,885 B2
(45) Date of Patent: Jun. 15, 2021

(54) SEMICONDUCTOR PACKAGING DEVICE COMPRISING A SHIELD STRUCTURE

(71) Applicant: Taiwan Semiconductor Manufacturing Co., Ltd., Hsin-Chu (TW)

(72) Inventors: Wei-Yu Chien, Hsin-Chu (TW); Chien-Hsien Tseng, Hsinchu (TW); Dun-Nian Yaung, Taipei (TW); Nai-Wen Cheng, Tainan (TW); Pao-Tung Chen, Tainan (TW); Yi-Shin Chu, Hsinchu (TW); Yu-Yang Shen, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/537,905

(22) Filed: Aug. 12, 2019

(65) Prior Publication Data

US 2021/0050303 A1    Feb. 18, 2021

(51) Int. Cl.
*H01L 23/552* (2006.01)
*H01L 23/538* (2006.01)
(Continued)

(52) U.S. Cl.
CPC .......... *H01L 23/552* (2013.01); *H01L 21/768* (2013.01); *H01L 21/76202* (2013.01);
(Continued)

(58) Field of Classification Search
CPC ............... H01L 23/552; H01L 23/5386; H01L 29/0649; H01L 21/76202; H01L 21/768; H01L 23/5384

See application file for complete search history.

(56) References Cited

U.S. PATENT DOCUMENTS 8,933,544 B2    1/2015  Mao et al.
8,970,000 B2 *  3/2015  Kerber ................. H01L 23/48
                                                          257/531
(Continued)

OTHER PUBLICATIONS

Wikipedia.org "Electromagnetic Shielding." Published on May 3, 2019.
(Continued)

*Primary Examiner* — Stephen M Bradley
*Assistant Examiner* — Wasiul Haider
(74) *Attorney, Agent, or Firm* — Eschweiler & Potashnik, LLC

(57) ABSTRACT

Various embodiments of the present application are directed towards a semiconductor packaging device including a shield structure configured to block magnetic and/or electric fields from a first electronic component and a second electronic component. The first and second electronic components may, for example, be inductors or some other suitable electronic components. In some embodiments, a first IC chip overlies a second IC chip. The first IC chip includes a first substrate and a first interconnect structure overlying the first substrate. The second IC chip includes a second substrate and a second interconnect structure overlying the second substrate. The first and second electronic components are respectively in the first and second interconnect structures. The shield structure is directly between the first and second electronic components. Further, the shield structure substantially covers the second electronic component and/or would substantially cover the first electronic component if the semiconductor packaging device was flipped vertically.

20 Claims, 22 Drawing Sheets

(51) Int. Cl.
*H01L 29/06* (2006.01)
*H01L 21/768* (2006.01)
*H01L 21/762* (2006.01)

(52) U.S. Cl.
CPC ...... *H01L 23/5384* (2013.01); *H01L 23/5386* (2013.01); *H01L 29/0649* (2013.01)

(56) References Cited

U.S. PATENT DOCUMENTS

| | | |
|---|---|---|
| 2009/0090995 A1 | 4/2009 | Yang et al. |
| 2010/0109133 A1 | 5/2010 | Ito et al. |
| 2014/0299976 A1 | 10/2014 | Cho |
| 2015/0115402 A1* | 4/2015 | Yen ..................... H01L 25/065 257/531 |

OTHER PUBLICATIONS

Vitatech.net "Magnetic Shielding." The date of publication is unknown. Retrieved online on May 29, 2019 from https://vitatech.net/services/magnetic-shielding/.

* cited by examiner

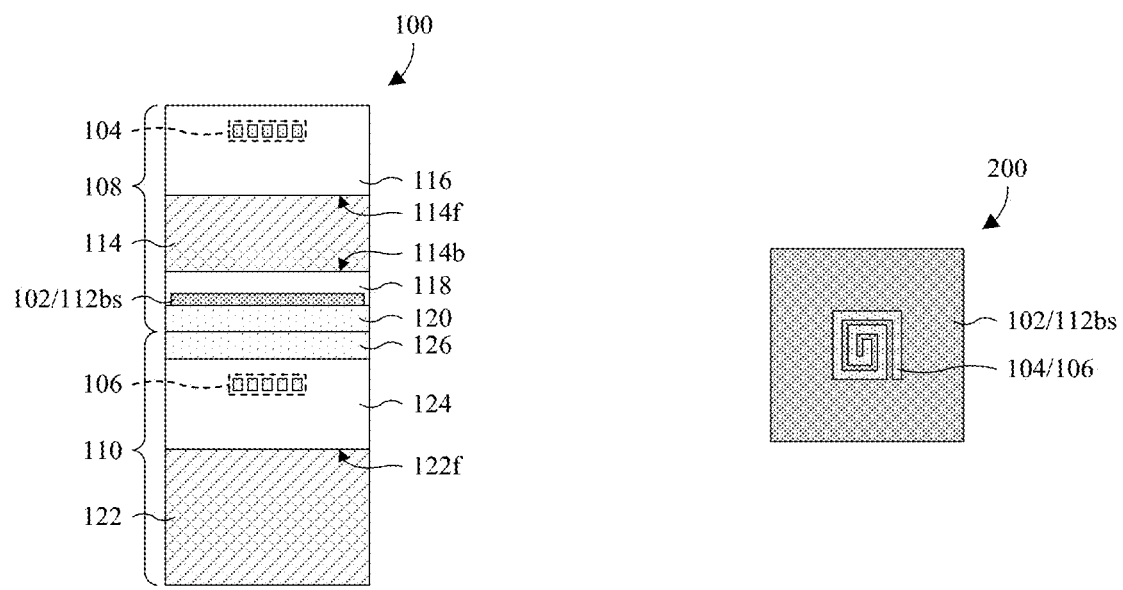
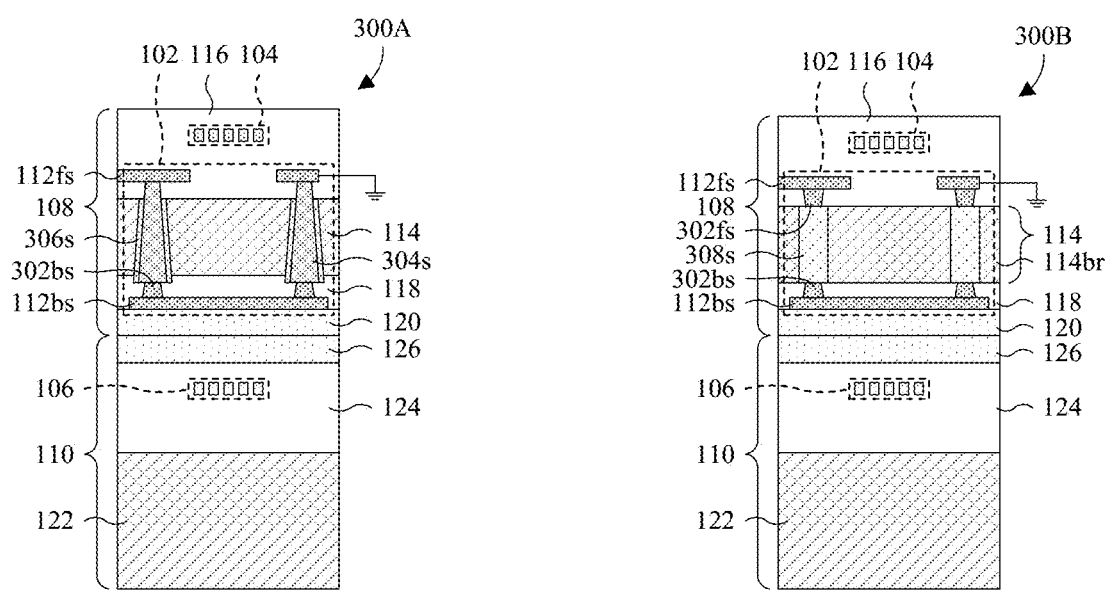

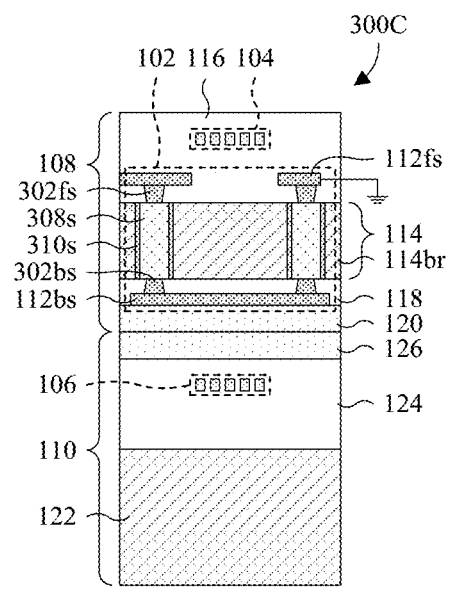
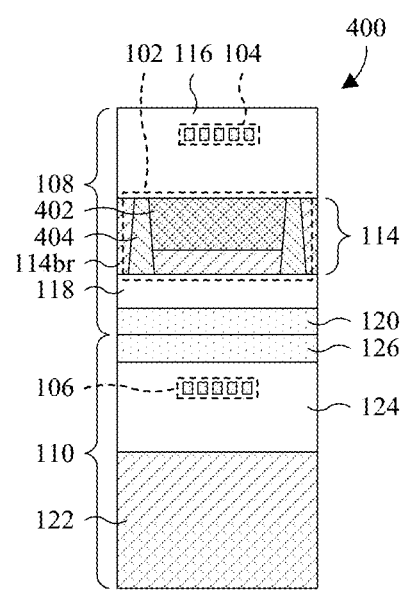
Fig. 3C
Fig. 4
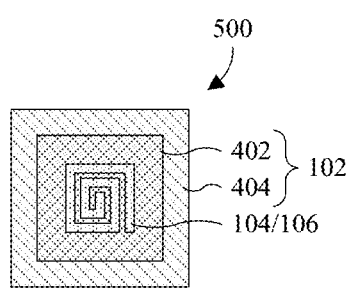
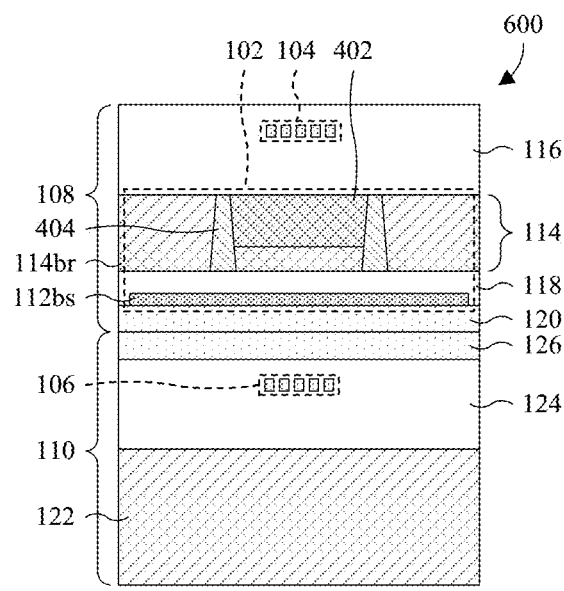
Fig. 5
Fig. 6

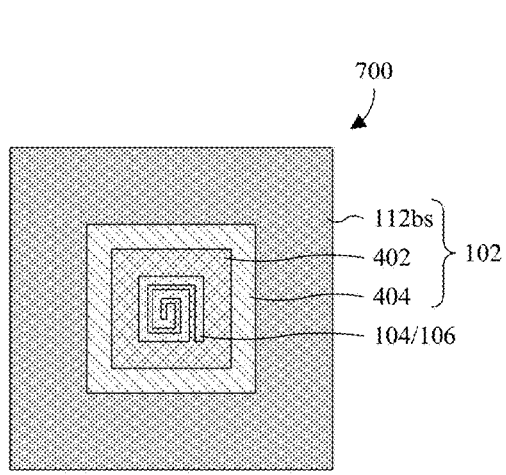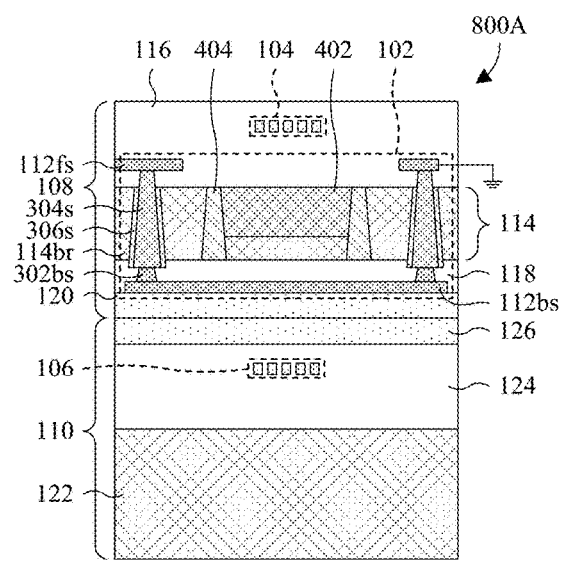
Fig. 7
Fig. 8A
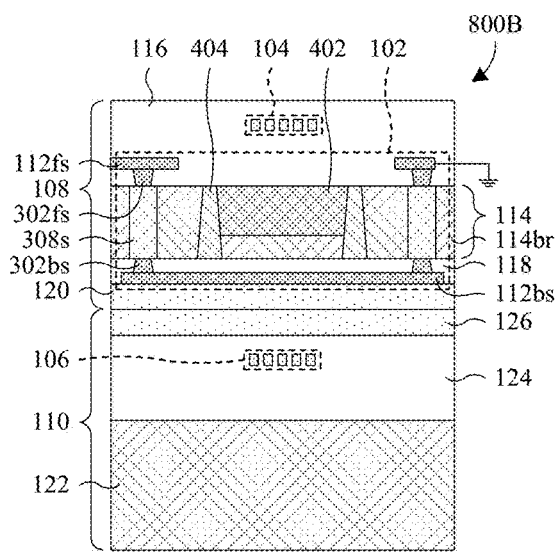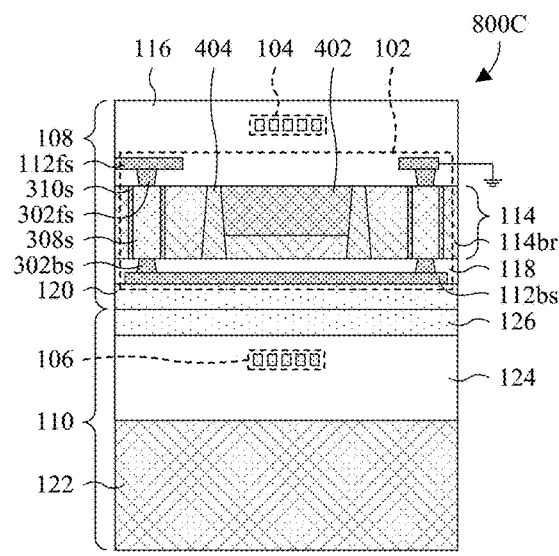
Fig. 8B
Fig. 8C

SEMICONDUCTOR PACKAGING DEVICE COMPRISING A SHIELD STRUCTURE

BACKGROUND

The semiconductor manufacturing industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of a three-dimensional integrated circuit (3DIC) in which a shield structure comprises a shield wire directly between electronic components.

FIG. 2 illustrates a top layout of some embodiments of the shield wire of FIG. 1 and the electronic components of FIG. 1.

FIGS. 3A-3C illustrate cross-sectional views of some alternative embodiments of the 3DIC of FIG. 1 in which electrical coupling to the shield wire is varied.

FIG. 4 illustrates a cross-sectional view of some alternative embodiments of the 3DIC of FIG. 1 in which the shield structure comprises a doped shield region of a substrate in place of the shield wire.

FIG. 5 illustrates a top layout of some embodiments of the doped shield region of FIG. 4 and the electronic components of FIG. 4.

FIG. 6 illustrates a cross-sectional view of some alternative embodiments of the 3DIC of FIG. 1 in which the shield structure further comprises a doped shield region of a substrate directly between the electronic components.

FIG. 7 illustrates a top layout of some embodiments of the shield structure of FIG. 6 and the electronic components of FIG. 6.

FIGS. 8A-8C illustrate cross-sectional views of some alternative embodiments of the 3DIC of FIG. 6 in which electrical coupling to the shield wire is varied

DETAILED DESCRIPTION

Figure 10A:
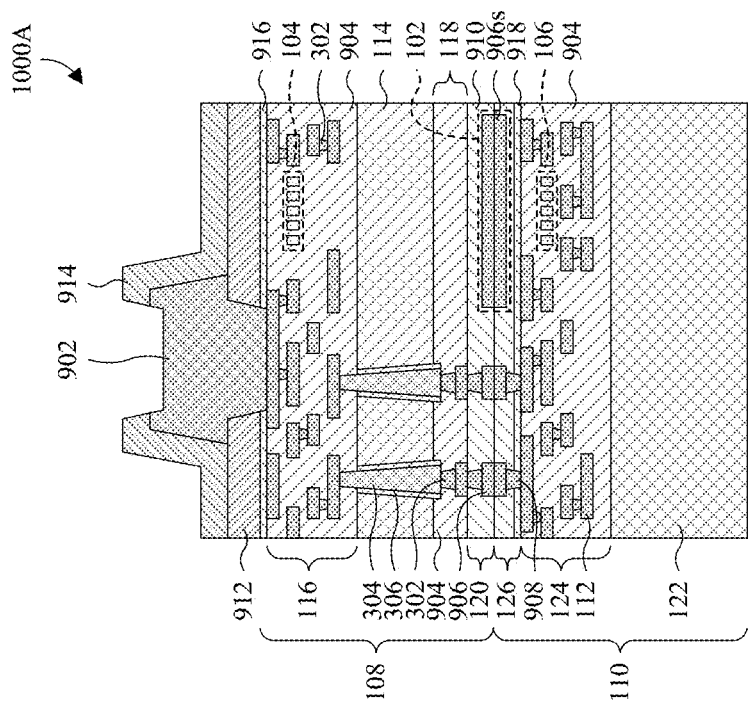
FIGS. 10A-10C illustrate cross-sectional views of some alternative embodiments of the 3DIC of FIG. 9 in which a location of the shield structure is varied.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a three-dimensional integrated circuit (3DIC) comprises a first integrated circuit (IC) chip and a second IC chip. The first IC chip comprises a first substrate and a first interconnect structure overlying the first substrate on a frontside of the first substrate. Similarly, the second IC chip comprises a second substrate and a second interconnect structure overlying the second substrate on a frontside of the second substrate. The second IC chip underlies the first IC chip and is bonded to a backside of the first substrate, such that the second interconnect structure is between the first and second substrates. A first inductor and a second inductor are respectively in the first and second interconnect structure. The first and second inductors have multiple applications, but one such application may, for example, be to smooth current on ground and power lines in the first and second interconnect structures.

In some embodiments, the first inductor completely covers and has a same top layout as the second inductor. Such embodiments may, for example, arise when the first and second inductors are formed by a photolithography/etching process using a same photoreticle or photomask. A photoreticle or photomask is expensive, such that reusing a photoreticle or photomask is a substantial cost savings. However, where the first inductor completely covers and has a same top layout as the second inductor, magnetic fields from the first and second inductors have a high propensity of disturbing the first and second inductors. Such disturbance may lead to increased noise at the first and second inductors and may negatively impact operation of the 3DIC. For example, operating voltages of the 3DIC may be shifted out of specification and/or performance of the 3DIC may be degraded.

Various embodiments of the present application are directed towards a 3DIC (or a semiconductor packaging device) in which a shield structure is directly between electronic components and is configured to block magnetic and/or electric fields from passing between the electronic components. In some embodiments, the 3DIC comprises a first IC chip and a second IC chip underlying the first IC chip. The first IC chip comprises a first substrate and a first interconnect structure overlying the first substrate. Similarly, the second IC chip comprises a second substrate and a second interconnect structure overlying the second substrate. A first electronic component and a second electronic component are respectively in the first and second interconnect structures. The first and second electronic components may, for example, be inductors or some other suitable electronic components. The shield structure is directly between and spaced from the first and second electronic components. Further, the shield structure substantially (or completely) covers the second electronic component and is configured to block magnetic and/or electric fields.

By arranging the shield structure directly between the first and second electronic components, the first electronic component does not disturb or minimally disturbs the second electronic component and vice versa. This, in turn, allows the same photoreticle or photomask to be used to form the first and second electronic components without the negative effects associated with the first and second electronic components disturbing each other. As noted above, using the same photoreticle or photomask to form the first and second electronic components is a substantial cost savings. Further, as noted above, the disturbances of the first and second electronic components could shift operating parameters of the 3DIC out of specification and/or degrade performance of the 3DIC.

With reference to FIG. 1, a cross-sectional view 100 of some embodiments of a 3DIC is provided in which a shield structure 102 is directly between a first electronic component 104 and a second electronic component 106. The first electronic component 104 directly overlies the second electronic component 106 and is in a first IC chip 108. The second electronic component 106 is in a second IC chip 110 that underlies and is bonded to the first IC chip 108. The first and second electronic components 104, 106 may, for example, be inductors or some other suitable passive electronic components. Active electronic components and other types of electronic components are, however, amenable in some embodiments.

In some embodiments, the first electronic component 104 completely covers and has a same top layout as the second electronic component 106. These embodiments may, for example, arise when the first and second electronic components 104, 106 are formed using a same photoreticle or photomask. As noted above, a photoreticle or photomask is expensive, such that using the same photoreticle or photomask for both the first and second electronic components 104, 106 is a substantial cost savings. Additionally, in some embodiments, the first and second electronic components 104, 106 are or comprise metal and/or some other suitable conductive material(s). These embodiments may, for example, arise at least when the first and second electronic components 104, 106 are inductors.

The shield structure 102 comprises a backside shield wire 112*bs* configured to block magnetic and/or electric fields from passing from the first electronic component 104 to the second electronic component 106 and vice versa. Absent the backside shield wire 112*bs*, the magnetic and/or electric fields from the first electronic component 104 may, for example, cause noise and/or other disturbances at the second electronic components 106 and vice versa. For example, in at least embodiments in which the first and second electronic components 104, 106 are inductors and the first electronic component 104 completely covers and has a same top layout as the second electronic component 106, magnetic fields from the first electronic component 104 may disturb the second electronic component 106 and vice versa.

Disturbances at the first and second electronic components 104, 106 may, for example, negatively impact operation of the 3DIC. For example, where the first and second electronic components 104, 106 are inductors used to smooth current on power and ground lines in the first and second IC chips 108, 110, the disturbances may transfer to the power and ground lines. This transfer may, for example, shift operating parameters of the 3DIC out of specification and/or otherwise degrade performance of the 3DIC.

In some embodiments, the backside shield wire 112*bs* blocks magnetic fields from the first and second electronic components 104, 106 by eddy-current losses. For example, the magnetic fields from the first and second electronic components 104, 106 may induce eddy currents in the first and second electronic 104, 106. These eddy currents may, in turn, produce magnetic fields that oppose the magnetic fields from the first and second electronic components 104, 106 and hence at least partially cancel out the magnetic fields from first and second electronic components 104, 106. In some embodiments, the backside shield wire 112*bs* redirects magnetic fields from the first and second electronic components 104, 106 around the first and second electronic components 104, 106. For example, where the backside shield wire 112*bs* is or comprises a material with high magnetic permeability, the backside shield wire 112*bs* draws in the magnetic fields from the first and second electronic 104, 106 and provides a path around the first and second electronic components 104, 106. A high magnetic permeability may, for example, be a material having a magnetic permeability greater than about $1.0 \times 10^{-2}$ Henries per meter (H/m), $2.5 \times 10$-2 H/m, or some other suitable value. Non-limiting examples of materials with high magnetic permeabilities include, for example, nickel-iron alloys.

In some embodiments, the backside shield wire 112*bs* blocks electric fields from the first and second electronic components 104, 106 by at least partially canceling the electric fields. For example, the electric fields from the first and second electronic components 104, 106 may induce a current in the backside shield wire 112*bs* that causes displacement of charge inside the backside shield wire 112*bs*. This displacement of charge may, in turn, cancel the electric fields from the first and second electronic components 104, 106 and hence prevent the electric fields from passing through the backside shield wire 112*bs*.

The backside shield wire 112*bs* has a pair of opposite sidewalls (at least when viewed in profile) and, in some embodiments, the first and/or second electronic component(s) 104, 106 is/are laterally between and laterally spaced from the opposite sidewalls. As such, in some embodiments, the backside shield wire 112*bs* substantially (or completely) covers the second electronic component 106 and/or would substantially (or completely) cover the first electronic component 104 if the 3DIC was flipped vertically. In some embodiments, the backside shield wire 112bs is electrically floating. For example, the backside shield wire 112bs may be completely surrounded by a dielectric and/or may be completely spaced from surrounding wires and/or vias. In some embodiments, the backside shield wire 112bs is or comprises copper, aluminum copper, some other suitable metal(s), or any combination of the foregoing.

The first IC chip 108 comprises a first substrate 114, a first frontside interconnect structure 116, a backside interconnect structure 118, and a first bond structure 120. The first frontside interconnect structure 116 overlies the first substrate 114 on a frontside 114f of the first substrate 114. The backside interconnect structure 118 and the first bond structure 120 underlie the first substrate 114 on a backside 114b of the first substrate 114, opposite the frontside 114f of the first substrate 114. Further, the backside interconnect structure 118 is between the first substrate 114 and the first bond structure 120. The first substrate 114 may, for example, be a bulk monocrystalline silicon substrate or some other suitable semiconductor substrate.

The second IC chip 110 comprises a second substrate 122, a second frontside interconnect structure 124, and a second bond structure 126. The second frontside interconnect structure 124 and the second bond structure 126 overlie the second substrate 122 on a frontside 122f of the second substrate 122. Further, the second frontside interconnect structure 124 is between the second bond structure 126 and the second substrate 122. Similar to the first substrate 114, the second substrate 122 may, for example, be a bulk monocrystalline silicon substrate or some other suitable semiconductor substrate.

While not shown, the first and second frontside interconnect structures 116, 124, the backside interconnect structure 118, and the first and second bond structures 120 at least partially provide electrical coupling between electronic components in the 3DIC. The first and second frontside interconnect structures 116, 124 each comprise an alternating stack of wires and vias defining conductive paths from the electronic components. Similarly, the backside interconnect structure 118 comprises an alternating stack of wires and vias defining conductive paths. The first and second bond structures 126 bond and electrically couple the backside interconnect structure 118 to the second frontside interconnect structure 124. Additionally, while not shown, conductive features extend through the first substrate 114 to electrically couple the first frontside interconnect structure 116 to the backside interconnect structure 118.

With reference to FIG. 2, a top layout 200 of some embodiments of the backside shield wire 112bs of FIG. 1 and the first and second electronic components 104, 106 of FIG. 1 is provided. The backside shield wire 112bs completely surrounds the first and second electronic components 104, 106 and, when viewed in profile, is between and completely separates the first electronic component 104 from the second electronic component 106. As above, the backside shield wire 112bs is configured to block magnetic and/or electric fields from passing from the first electronic component 104 to the second electronic component 106 and vice versa. This prevents the first and second electronic components 104, 106 from disturbing each other.

The first and second electronic components 104, 106 are inductors and have the same spiral-shaped top layout. Other top layouts are, however, amenable in alternative embodiments. Further, the first and second electronic components 104, 106 completely overlap, such that the first and second electronic components 104, 106 are shown by the same element. The first and second electronic components 104, 106 may, for example, be or comprise copper, aluminum copper, some other suitable metal(s), or any combination of the foregoing. In some embodiments, the first and second electronic components 104, 106 are or comprise the same material as the backside shield wire 112bs.

With reference to FIG. 3A, a cross-sectional view 300A of some alternative embodiments of the 3DIC of FIG. 1 is provided in which the backside shield wire 112bs is electrically coupled to the first frontside interconnect structure 116. Such electrical coupling is achieved by backside shield vias 302bs in the backside interconnect structure 118 and through substrate shield vias 304s in the first substrate 114. The backside shield vias 302bs extend from the backside shield wire 112bs to the through substrate shield vias 304s. The through substrate shield vias 304s extend from the backside shield vias 302bs to frontside shield wires 112fs in the first frontside interconnect structure 116. In some embodiments, during operation of the 3DIC, the backside shield wire 112bs is electrically coupled to ground (as illustrated) or otherwise biased at the first frontside interconnect structure 116.

The backside shield vias 302bs, the through substrate shield vias 304s, and the frontside shield wires 112fs are conductive and may, for example, be or comprise copper, aluminum copper, some other suitable metal(s), or any combination of the foregoing. In some embodiments, the backside shield vias 302bs are integrated with the backside shield wire 112bs. The through substrate shield vias 304s are separated from the first substrate 114 by individual shield via dielectric layers 306s. The shield via dielectric layers 306s may be or comprise, for example, silicon oxide and/or some other suitable dielectric(s).

With reference to FIG. 3B, a cross-sectional view 300B of some alternative embodiments of the 3DIC of FIG. 3A is provided in which doped shield channels 308s are used in place of the through substrate shield vias 304s. The doped shield channels 308s are doped regions of the first substrate 114 having an opposite doping type as a bulk region 114br of the first substrate 114, so as to create PN junctions with the bulk region 114br. The PN junctions lead to depletion regions along the doped shield channels 308s that provide electrical isolation between the doped shield channels 308s and the bulk region 114br of the first substrate 114. The first substrate 114 may, for example, be a bulk monocrystalline silicon substrate or some other suitable semiconductor substrate. The doped shield channels 308s and the bulk region 114br of the first substrate 114 may, for example, respectively be N-type and P-type or vice versa.

The doped shield channels 308s extend from the backside shield vias 302bs, through the first substrate 114, to frontside shield vias 302fs. The frontside shield vias 302fs extend from the doped shield channels 308s to the frontside shield wires 112fs. The frontside shield vias 302fs are conductive and may, for example, be or comprise metal and/or some other suitable conductive material(s).

With reference to FIG. 3C, a cross-sectional view 300C of some alternative embodiments of the 3DIC of FIG. 3B is provided in which the doped shield channels 308s are separated from the bulk region 114br of the first substrate 114 by individual doped shield wells 310s. In alternative embodiments, the doped shield channels 308s are separated from the bulk region 114br of the first substrate 114 by a shared doped shield well. The doped shield well 310s are doped regions of the first substrate 114. Further, the doped shield channels 308s and the bulk region 114br of the first substrate 114 have a first doping type, whereas the doped shield wells 310s have a second doping type opposite the first doping type. For example, the doped shield channels 308s and the bulk region 114br of the first substrate 114 may be N-type, whereas the doped shield wells 310s may be P-type, or vice versa.

With reference to FIG. 4, a cross-sectional view 400 of some alternative embodiments of the 3DIC of FIG. 1 is provided in which a doped shield 402 is used in place of the backside shield wire 112bs to block magnetic and/or electric fields from the first and second electronic components 104, 106. The doped shield 402 is a doped region of the first substrate 114 having an opposite doping type as adjoining and/or neighboring regions of the first substrate 114. For example, the doped shield 402 may have an opposite doping type as the bulk region 114br of the first substrate 114. As another example, the doped shield 402 may have an opposite doping type as a doped shield well (not shown) that is in the first substrate 114 and that surrounds the doped shield 402. The doped shield 402 and the bulk region 114br of the first substrate 114 may, for example, respectively be N-type and P-type or vice versa.

As with the backside shield wire 112bs of FIG. 1, the doped shield 402 is configured to block magnetic and/or electric fields from passing from the first electronic component 104 to the second electronic component 106 and vice versa. Absent the doped shield 402, the magnetic and/or electric fields from the first electronic component 104 may, for example, cause noise and/or other disturbances at the second electronic component 106 and vice versa. Disturbances at the first and second electronic components 104, 106 may, for example, negatively impact operation of the 3DIC. For example, the disturbances may shift operating parameters of the 3DIC out of specification and/or otherwise degrade performance of the 3DIC.

In some embodiments, the doped shield 402 blocks magnetic fields from the first and second electronic components 104, 106 by eddy-current losses. An example of how this occurs is described above for the backside shield wire 112bs of FIG. 1. Further, in some embodiments, the backside shield wire 112bs blocks electric fields from the first and second electronic components 104, 106 by at least partially canceling the electric fields. An example of how this occurs is also described above for the backside shield wire 112bs of FIG. 1.

The doped shield 402 has a pair of opposite sidewalls (at least when viewed in profile) and, in some embodiments, the first and/or second electronic component(s) 104, 106 is/are laterally between and laterally spaced from the opposite sidewalls. As such, in some embodiments, the doped shield 402 substantially (or completely) covers the second electronic component 106 and/or would substantially (or completely) cover the first electronic component 104 if the 3DIC was flipped vertically. In some embodiments, the doped shield 402 has a high doping concentration and hence a high conductivity. A high doping concentration may, for example, be between about $10^{17}$-$10^{20}$ atoms per cubic centimeter (cm$^3$), greater than about $10^{17}$ atoms/cm$^3$, or some other suitable value. In some embodiments, the doped shield 402 is electrically floating. In alternative embodiments, the doped shield 402 is electrically biased to ground or some other suitable voltage.

In some embodiments, a shield isolation structure 404 extends through the first substrate 114 and laterally separates the doped shield 402 from a remainder of the first substrate 114. The shield isolation structure 404 may, for example, be or comprise a trench isolation structure or some other suitable isolation structure. Further, the shield isolation structure 404 may, for example, be or comprise silicon oxide and/or some other suitable dielectric(s).

With reference to FIG. 5, a top layout 500 of some embodiments of the doped shield 402 of FIG. 4 and the first and second electronic components 104, 106 of FIG. 4 is provided. The doped shield 402 completely surrounds the first and second electronic components 104, 106, and is completely surrounded by the shield isolation structure 404. Further, when viewed in profile, the doped shield 402 is between and completely separates the first electronic component 104 from the second electronic component 106. The first and second electronic components 104, 106 may, for example, be as described with regard to FIG. 2.

With reference to FIG. 6, a cross-sectional view 600 of some alternative embodiments of the 3DIC of FIG. 1 is provided in which the shield structure 102 further comprises the doped shield 402 directly between the first and second electronic components 104, 106. The doped shield 402 is a doped region of the first substrate 114 and is configured to block magnetic and/or electric fields from passing from the first electronic component 104 to the second electronic component 106 and vice versa. In some embodiments, the doped shield 402 is laterally separated from a remainder of the first substrate 114 by the shield isolation structure 404. The doped shield 402 and/or the shield isolation structure 404 may, for example, be as illustrated and/or described with regard to FIG. 4.

With reference to FIG. 7, a top layout 700 of some embodiments of the shield structure 102 of FIG. 6 and the first and second electronic components 104, 106 of FIG. 6 is provided. The backside shield wire 112bs and the doped shield 402 may, for example, respectively be as illustrated and/or described with regard to FIGS. 2 and 5. Additionally, the first and second electronic components 104, 106 may, for example, be as illustrated and/or described with regard to FIGS. 2 and 5.

With reference to FIGS. 8A-8C, cross-sectional views 800A-800C of some alternative embodiments of the 3DIC of FIG. 6 are provided in which electrical coupling to the backside shield wire 112bs is varied. FIGS. 8A-8C provide the electrical coupling as illustrated and/or described respectively with regard to FIGS. 3A-3C. For example, FIG. 8A provides the electrical coupling using through substrate shield vias 304s in FIG. 3A, whereas FIGS. 8B and 8C provide the electrical coupling using doped shield channels 308s in FIGS. 3B and 3C.

Figure 9:
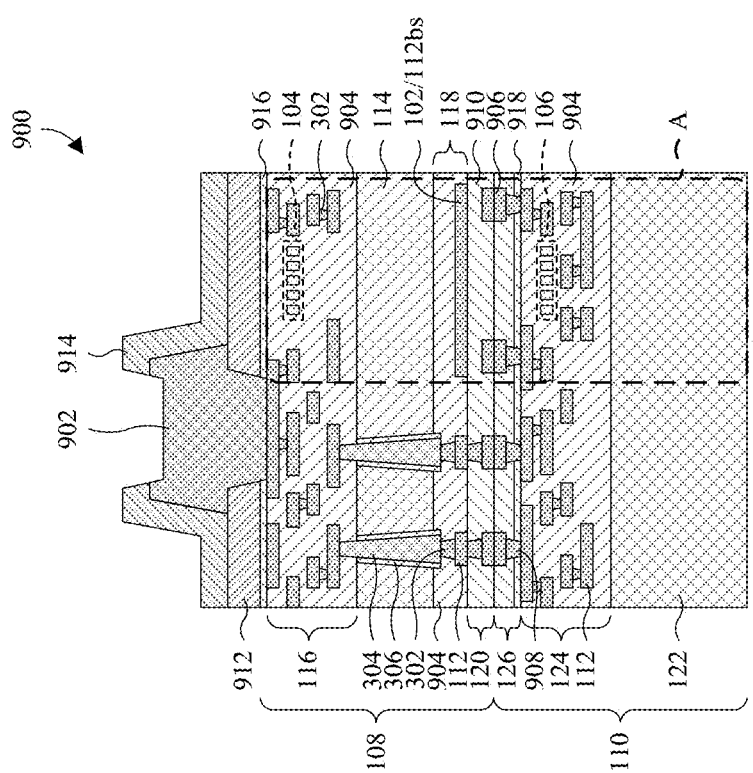
FIG. 9 illustrates an expanded cross-sectional view of some more detailed embodiments of the 3DIC of FIG. 1 in which various interconnect and bond structures are shown in greater detail and a pad structure is along a top surface of the 3DIC.

With reference to FIG. 9, an expanded cross-sectional view 900 of some more detailed embodiments of the 3DIC of FIG. 1 is provided in which the first and second frontside interconnect structures 116, 124, the backside interconnect structure 118, and the first and second bond structures 120, 126 are shown in greater detail. Further, a pad structure 902 is along a top of the 3DIC and is electrically coupled to the first frontside interconnect structure 116. FIG. 1 may, for example, correspond to box A.

The first and second frontside interconnect structures 116, 124 and the backside interconnect structure 118 comprise alternating stacks of wires 112 and vias 302 defining conductive paths. Note that wires and vias electrically coupled to and/or defining the shield structure 102 may, for example, be more specifically referred to as shield wires and shield vias. The wires 112 and the vias 302 are surrounded by corresponding interconnect dielectric layers 904. The interconnect dielectric layers 904 may be or comprise, for example, silicon oxide, a low k dielectric, some other suitable dielectric(s), or any combination of the foregoing.

The wires 112 and the vias 302 may be or comprise copper and/or some other suitable metal(s).

Through substrate vias (TSVs) 304 are in the first substrate 114 and extend through the first substrate 114 to electrically couple the first frontside interconnect structure 116 to the backside interconnect structure 118. The TSVs 304 are conductive and are separated from the first substrate 114 by via dielectric layers 306. The TSVs 304 and the via dielectric layers 306 may, for example, respectively be as the through substrate shield vias 304s of the FIG. 3A and the shield via dielectric layers 306s of FIG. 3A are illustrated and/or described.

The first and second bond structures 120, 126 bond and electrically couple the backside interconnect structure 118 to the second frontside interconnect structure 124 at a hybrid bond. In alternative embodiments, micro bumps and/or other suitable bonding structure(s) may be used. The first and second bond structures 120, 126 comprise individual bond pads 906 contacting at the hybrid bond, and further comprise individual bond contacts 908 extending form the bond pads 906 respectively to the backside interconnect structure 118 and the second frontside interconnect structure 124. The bond pads 906 and the bond contacts 908 are surrounded and electrically isolated by corresponding bond dielectric layers 910. The bond dielectric layers 910 contact at the hybrid bond and may be or comprise, for example, silicon oxide and/or some other suitable dielectric(s). The bond pads 906 and the bond contacts 908 may be or comprise copper and/or some other suitable metal(s).

The pad structure 902 overlies and is electrically coupled to the first frontside interconnect structure 116. A first passivation layer 912 is between the pad structure 902 and the first frontside interconnect structure 116, and the pad structure 902 protrudes through the first passivation layer 912 to the first frontside interconnect structure 116. A second passivation layer 914 lines sidewalls of and partially covers the pad structure 902. The pad structure 902 may be or comprise aluminum and/or some other suitable metal(s). The first and second passivation layers 912, 914 may be or comprise silicon oxide, silicon nitride, some other suitable dielectric(s), or any combination of the foregoing.

A first etch stop layer 916 and a second etch stop layer 918 are respectively along top surfaces of the first and second frontside interconnect structures 116, 124. The first etch stop layer 916 separates the first and second passivation layers 912, 914 from the first frontside interconnect structure 116. The second etch stop layer 918 separates the second bond structure 126 from the second frontside interconnect structure 124. The first and second etch stop layers 916, 918 each comprises a different dielectric than an overlying and adjoining dielectric layer. The first and second etch stop layers 916, 918 may be or comprise silicon nitride, silicon carbide, some other suitable dielectric(s), or any combination of the foregoing.

While the shield structure 102 is illustrated using embodiments of the shield structure 102 in FIG. 1, embodiments of the shield structure 102 in any one of FIGS. 3A-3C, 4, 6, and 8A-8C may alternatively be used. For example, the shield structure 102 may additionally or alternatively include the doped shield 402 as in FIGS. 4 and 6. As another example, the shield structure 102 may be electrically coupled to the first frontside interconnect structure 116 as illustrated in any one of FIGS. 3A-3C and 8A-8C. Similarly, while the portion of the 3DIC in box A may, for example, correspond to FIG. 1, the portion may alternatively be modified to correspond to any one of FIGS. 3A-3C, 4, 6, and 8A-8C.

With reference to FIG. 10A, a cross-sectional view 1000A of some alternative embodiments of the 3DIC of FIG. 9 is provided in which a pair of shield bond pads 906s in the first and second bond structures 120, 126 is used in place of the backside shield wire 112bs to block magnetic and/or electric fields from the first and second electronic components 104, 106. The shield bond pads 906s are as the bond pads 906 are described with regard to FIG. 9, except that the shield bond pads 906s define the shield structure 102.

Figure 10C:
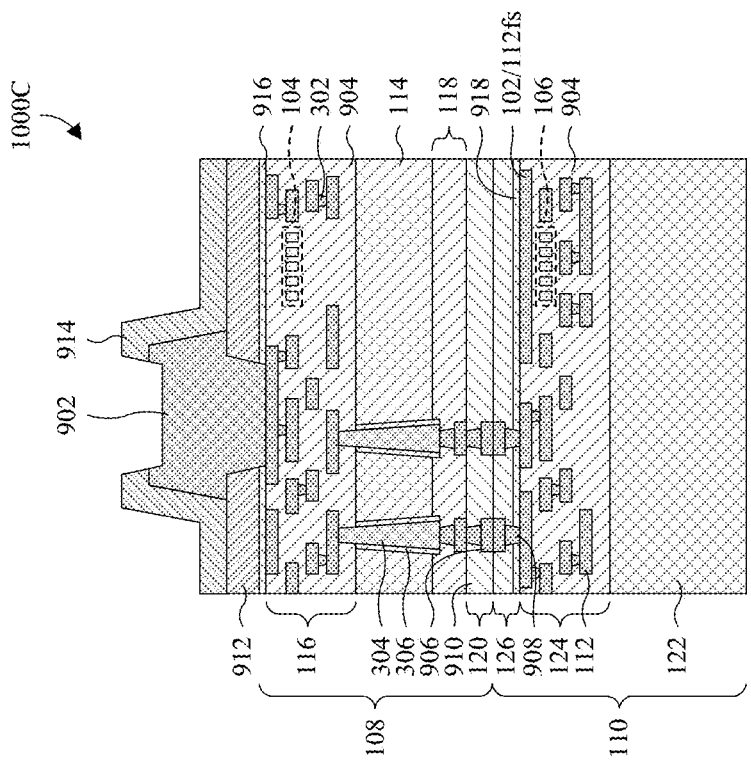
Figure 10B:
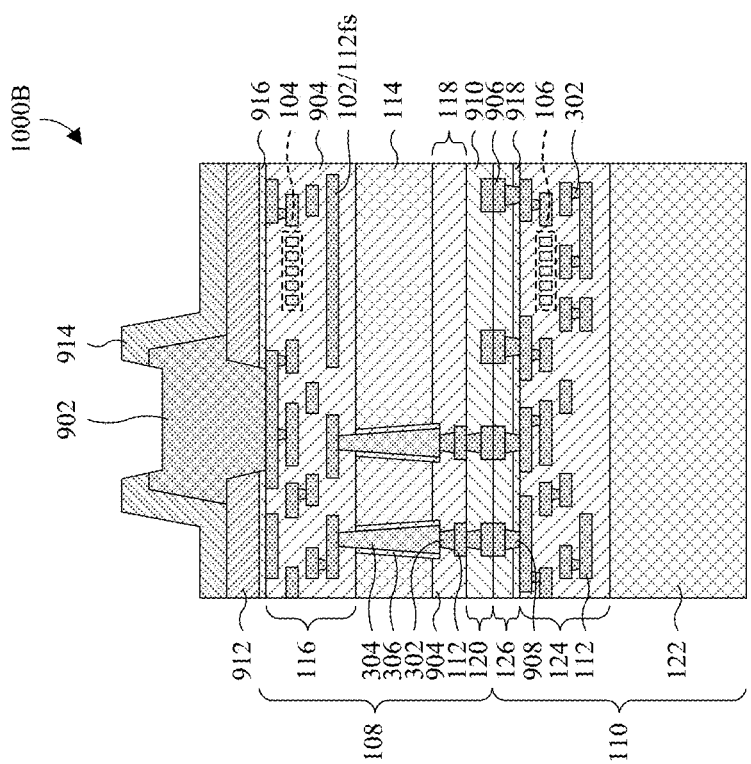

With reference to FIG. 10B, a cross-sectional view 1000B of some alternative embodiments of the 3DIC of FIG. 9 is provided in which a frontside shield wire 112fs in the first frontside interconnect structure 116 is used in place of the backside shield wire 112bs to block magnetic and/or electric fields from the first and second electronic components 104, 106. In alternative embodiments, as illustrated in a cross-sectional view 1000C of FIG. 10C, the frontside shield wire 112fs is in the second frontside interconnect structure 124.

While the shield structures 102 in FIGS. 10A-10C are not shown as being electrically coupled to the first frontside interconnect structure 116, the shield structures 102 may be electrically coupled to the first frontside interconnect structure 116 in alternative embodiments. For example, the shield structure 102 of FIG. 10A may be electrically coupled to the first frontside interconnect structure 116 as illustrated for the neighboring bond pads 906. As another example, the shield structure 102 of FIG. 10B may be electrically coupled to the first frontside interconnect structure 116 by a via in the first frontside interconnect structure 116. As another example, the shield structure 102 of FIG. 10C may be electrically coupled to the first frontside interconnect structure 116 as illustrated for the neighboring wires 112 in the second frontside interconnect structure 124. Additionally, while the shield structures 102 in FIGS. 10A-10C are not shown as including the doped shield 402 at FIG. 4, the shield structures 102 may include the doped shield 402 in alternative embodiments.

While the 3DICs of FIGS. 10A-10C illustrate TSVs 304 electrically coupling the first frontside interconnect structure 116 to the backside interconnect structure 118, doped channels may instead be used in alternative embodiments. The doped channels may, for example, be as illustrated and/or described in any one of FIGS. 3B, 3C, 8B, and 8C.

Figure 11A:
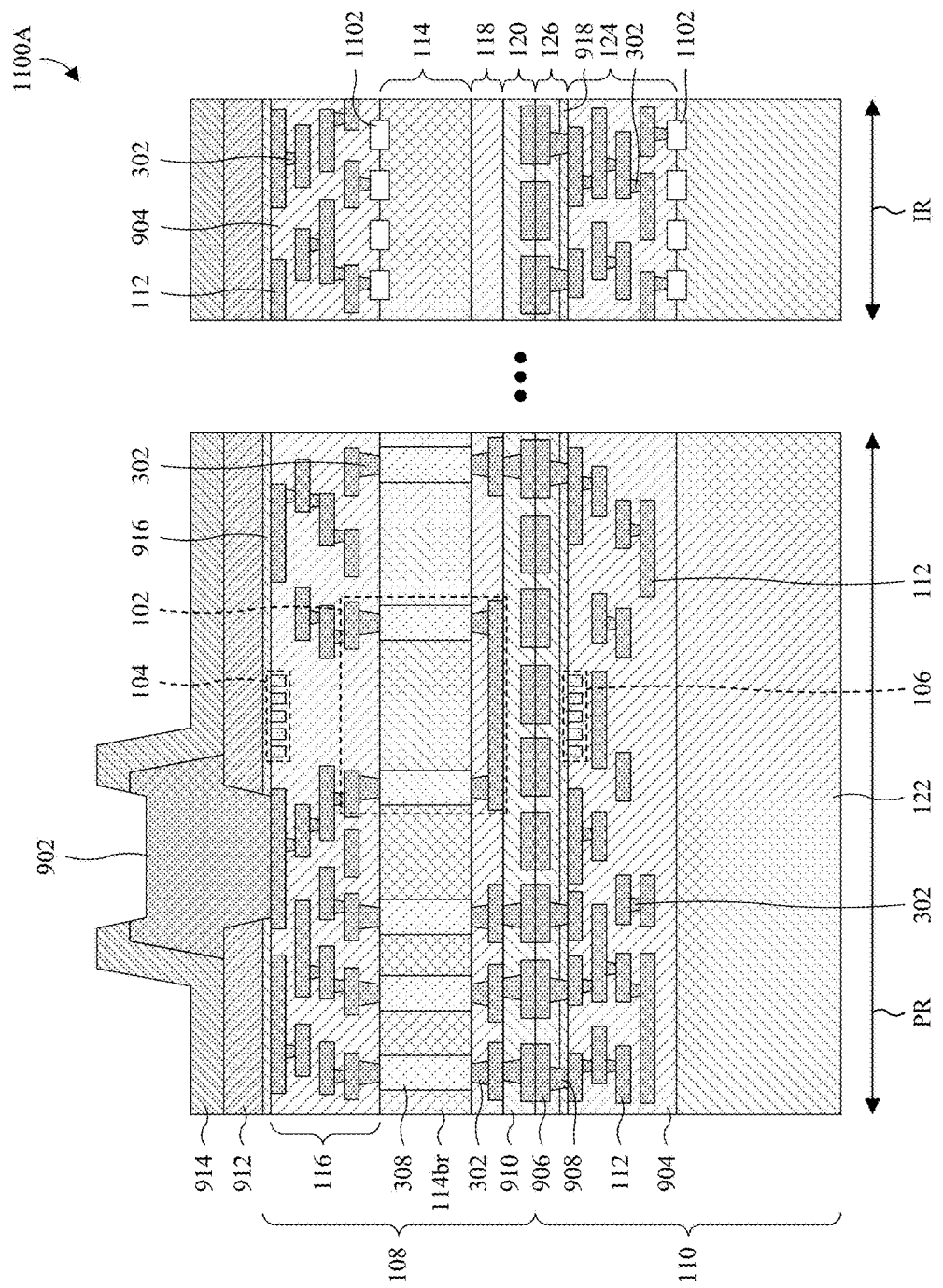
FIGS. 11A and 11B illustrate cross-sectional views of some embodiments of a 3DIC comprising an interior region IR and a peripheral region PR in which the shield structures of FIGS. 3B and 8A are respectively at the peripheral region PR.

With reference to FIG. 11A, a cross-sectional view 1100A of some embodiments of a 3DIC comprising an interior region IR and a peripheral region PR is provided in which the shield structure 102 of FIG. 3B is at the peripheral region PR and is directly between the first and second electronic components 104, 106. Further, the doped channels 308 electrically couple the first frontside interconnect structure 116 to the backside interconnect structure 118.

The peripheral region PR is at a periphery the 3DIC and provides external electrical coupling to the 3DIC by way of the pad structure 902 and other pad structures (not shown). The interior region IR is at an interior of the 3DIC and accommodates semiconductor devices 1102 configured to perform logic functions and/or other suitable functions. The semiconductor devices 1102 may be or comprise, for example, metal-oxide semiconductor field-effect transistor (MOSFETs) and/or some other suitable semiconductor devices.

Figure 11B:
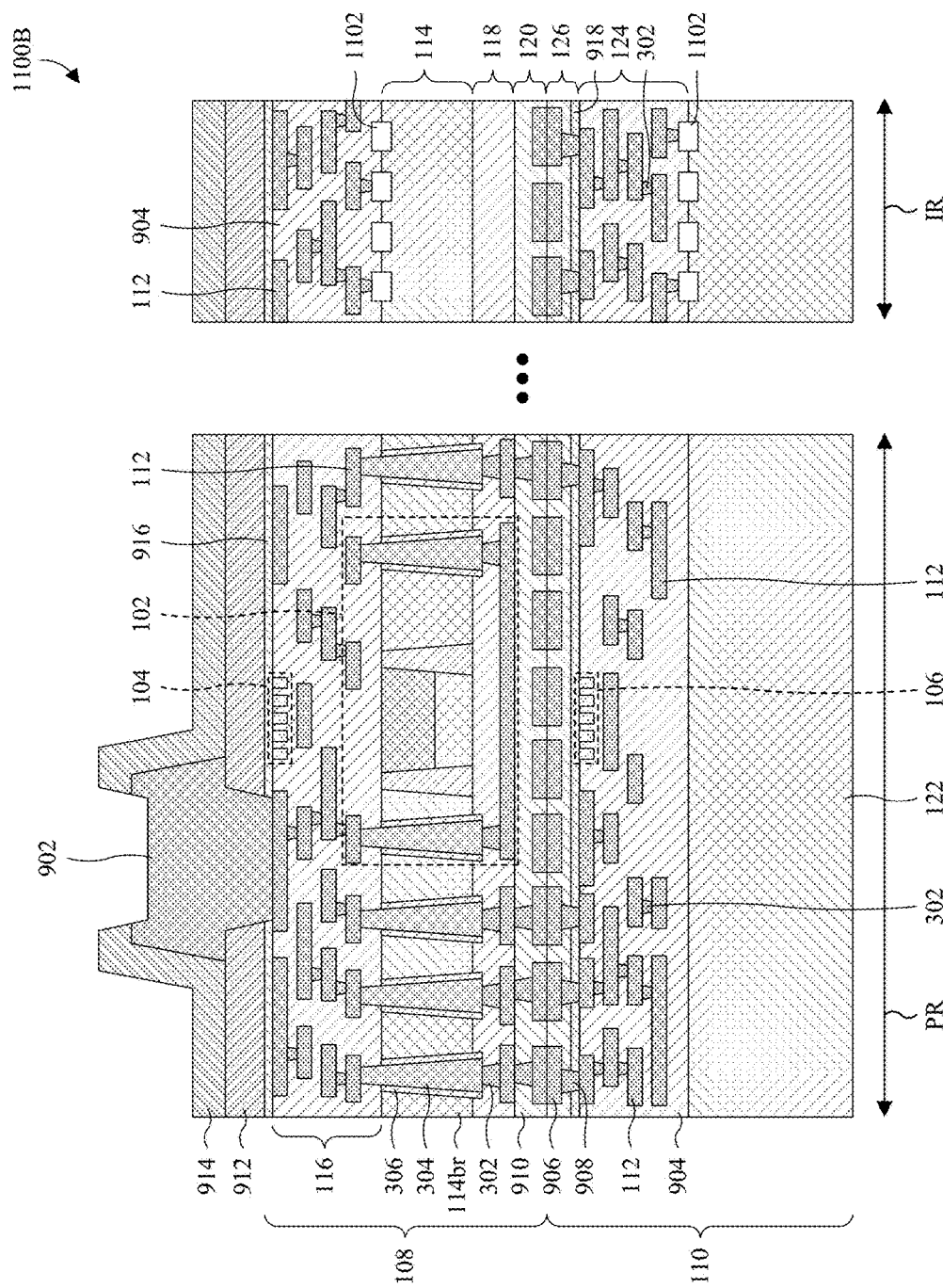

With reference to FIG. 11B, a cross-sectional view 1100B of some alternative embodiments of the 3DIC of FIG. 11A is provided in which the shield structure 102 of FIG. 8A is directly between the first and second electronic components 104, 106 instead of the shield structure 102 of FIG. 3B. Further, the TSVs 304 electrically couple the first frontside interconnect structure 116 to the backside interconnect structure 118 instead of the doped channels 308.

While FIG. 11A is illustrated and described with embodiments of the shield structure in FIG. 3B, the shield structure 102 in any one of FIGS. 1, 3A, 3C, 4, 6, 8A-8C, 9, and 10A-10C may alternatively be used. Similarly, while FIG. 11B is illustrated and described with embodiments of the shield structure in FIG. 8A, the shield structure 102 in any one of FIGS. 1, 3A-3C, 4, 6, 8B, 8C, 9, and 10A-10C may alternatively be used. While FIGS. 1, 2, 3A-3C, 4, 5, 6, 7, 8A-8C, 9, 10A-10C, 11A, and 11B are described as illustrating 3DICs, these figures may more generally or alternatively be described as illustrating semiconductor packaging devices.

With reference to FIGS. 12-26, a series of cross-sectional views 1200-2600 of some embodiments of a method for forming a 3DIC (or a semiconductor packaging device) is provided in which a shield structure comprises a backside shield wire directly between electronic components. The 3DIC being formed may, for example, correspond to the 3DIC of FIG. 11A.

Figure 12:
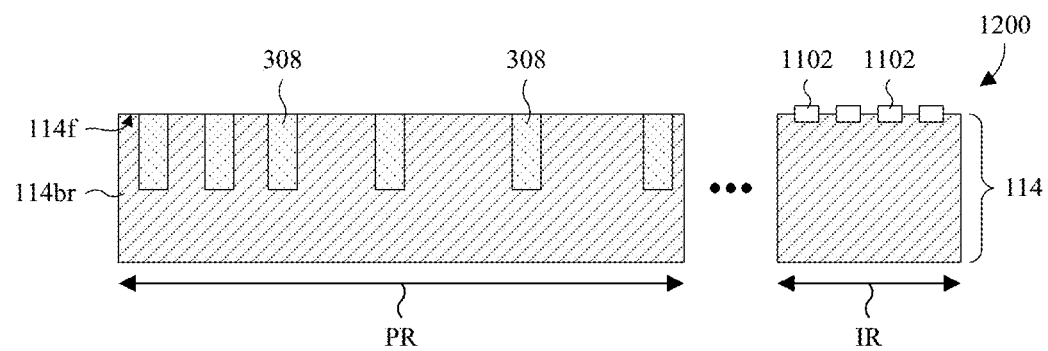
FIGS. 12-26 illustrate a series of cross-sectional views of some embodiments of a method for forming a 3DIC in which a shield structure comprises a shield wire directly between electronic components.

As illustrated by the cross-sectional view 1200 of FIG. 12, a first substrate 114 is doped from a frontside 114$f$ of the first substrate 114 to form doped channels 308 at a peripheral region PR of the 3DIC being formed. The doped channels 308 extend partially through the first substrate 114 and are doped regions of the first substrate 114 having an opposite doping type as a bulk region 114$br$ of the first substrate 114. For example, the doped channels 308 may be N-type and the bulk region 114$br$ may be P-type or vice versa. The first substrate 114 may, for example, be a bulk silicon substrate or some other suitable semiconductor substrate. In some embodiments, a process for forming the doped channels 308 comprises: 1) forming a mask (not shown) on the frontside 114$f$ of the first substrate 114; 2) implanting dopants into the frontside 114$f$ of the first substrate 114 with the mask in place; and 3) removing the mask. The mask may, for example, be or comprise photoresist and/or a hard mask material.

Also illustrated by the cross-sectional view 1200 of FIG. 12, semiconductor devices 1102 are formed on the frontside 114$f$ of the first substrate 114. The semiconductor devices 1102 are formed at an interior region IR of the 3DIC being formed and may, for example, be MOSFETs and/or some other suitable semiconductor devices.

Figure 13:
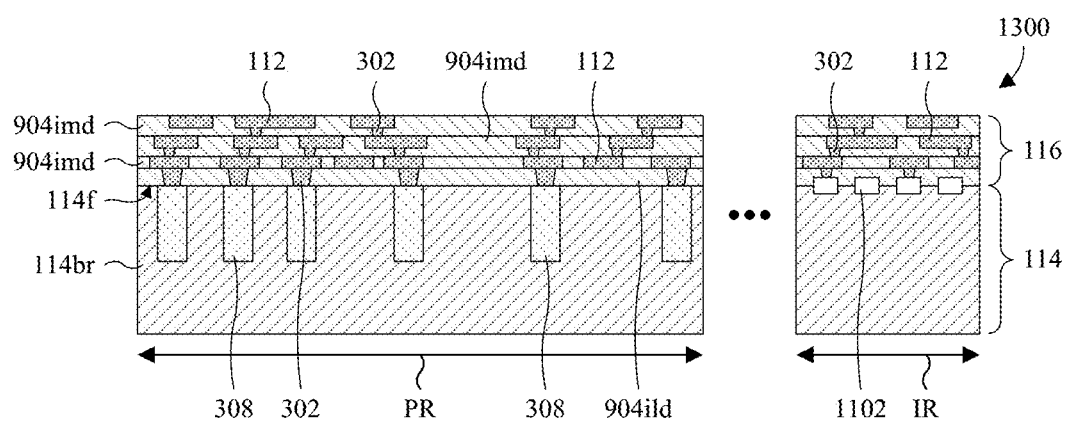

As illustrated by the cross-sectional view 1300 of FIG. 13, a first frontside interconnect structure 116 is partially formed on the frontside 114$f$ of the first substrate 114. The first frontside interconnect structure 116 comprises an interlayer dielectric (ILD) layer 904$ild$ and a plurality of intermetal dielectric (IMD) layers 904$imd$ stacked over the ILD layer 904$ild$. Further, the first frontside interconnect structure 116 comprises a plurality of wires 112 and a plurality of vias 302 alternatingly stacked in the ILD and IMD layers 904$ild$, 904$imd$. The wires 112 and the vias 302 are conductive and define conductive paths leading from the doped channels 308 and the semiconductor devices 1102.

In some embodiments, a process for partially forming the first frontside interconnect structure 116 comprises: 1) forming a bottommost level of the vias 302 by a single damascene process; 2) forming a bottommost level of the wires 112 by the single damascene process; and 3) repeatedly performing a dual damascene process to form additional wire and via levels. Other processes are, however, amenable. The single damascene process may, for example, comprise: 1) depositing a dielectric layer (e.g., the ILD layer 904$ild$ or one of the IMD layers 904$imd$); 2) patterning the dielectric layer to form openings for a single level of wires or vias; 3) depositing a metal layer in the openings; and 4) performing a planarization into the conductive layer until a top surface of the conductive layer is even with a top surface of the dielectric layer. The dual damascene process may, for example, be as the single damascene process is described except that the patterning at 3) forms openings for a level of wires and a level of vias. Other processes are, however, amenable for the single and dual damascene processes.

Figure 14:
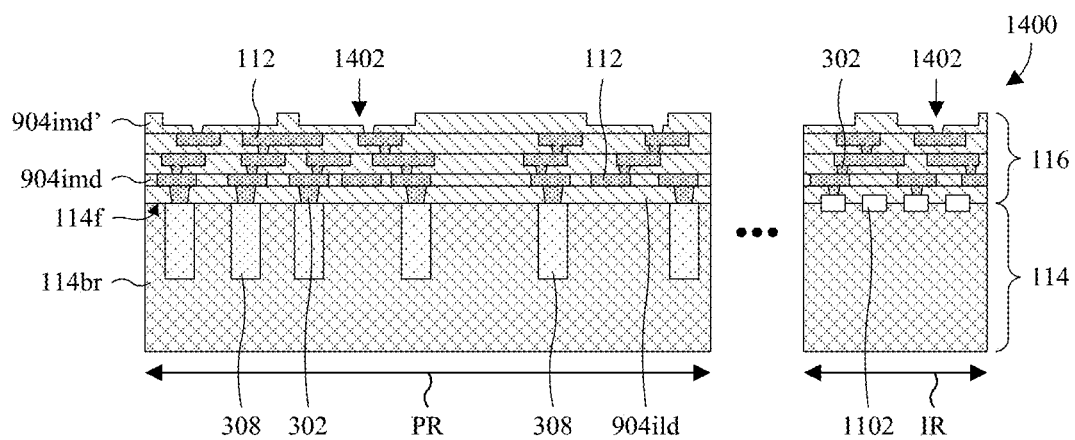

As illustrated by the cross-sectional view 1400 of FIG. 14, a top IMD layer 904$imd'$ is formed over the other IMD layers 904$imd$ and is patterned to form interconnect openings 1402 for a level of wires and a level of vias. The patterning may, for example, be performed by a photolithography/etching process or some other suitable patterning process.

Figure 15:
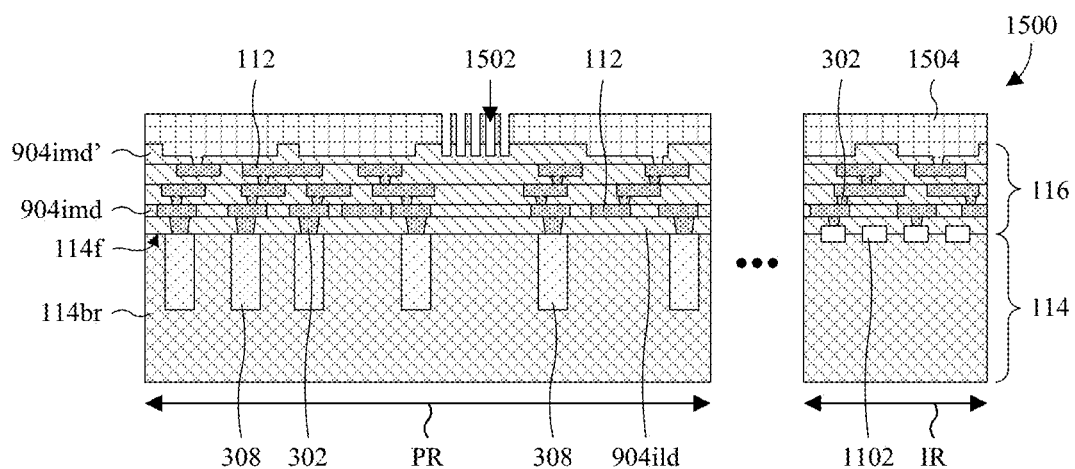

As illustrated by the cross-sectional view 1500 of FIG. 15, the top IMD layer 904$imd'$ is patterned to form a first electronic component opening 1502. Note that while the first electronic component opening 1502 is shown as being formed after the interconnect openings 1402 of FIG. 14, the first electronic component opening 1502 may be formed before the interconnect openings 1402 of FIG. 14 in alternative embodiments. The first electronic component opening 1502 may, for example, correspond to an inductor or some other suitable electronic component being formed. The first electronic component opening 1502 may, for example, have the same top layout as the first electronic component 104 in any one of FIGS. 2, 5, and 7. Other top layouts are, however, amenable.

In some embodiments, a process for forming the first electronic component opening 1502 comprise: 1) forming a mask 1504 over the top IMD layer 904$imd'$; 2) performing an etch into the top IMD layer 904$imd'$ with the mask 1504 in place; and 3) removing the mask 1504. Other processes are, however, amenable. The mask 1504 may, for example, be or comprise photoresist and/or a hard mask material. In some embodiments, the mask 1504 is photoresist that is patterned by photolithography using a photoreticle or photomask.

Figure 16:
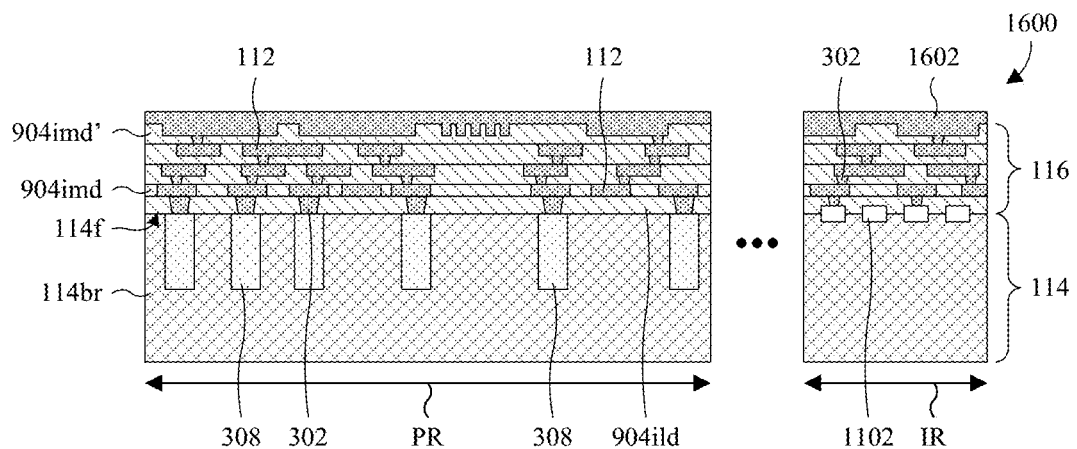

As illustrated by the cross-sectional view 1600 of FIG. 16, a conductive layer 1602 is deposited in the first electronic component opening 1502 of FIG. 15 and the interconnect openings 1402 of FIG. 14. The conductive layer 1602 may be or comprise, for example, metal and/or some other suitable conductive material(s).

Figure 17:
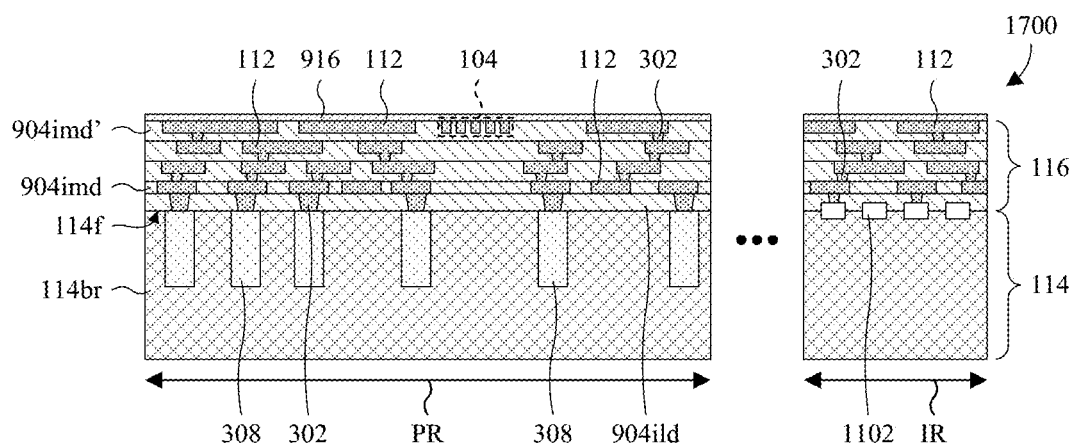

As illustrated by the cross-sectional view 1700 of FIG. 17, a planarization is performed into the conductive layer 1602 (see FIG. 16) until a top surface of the conductive layer 1602 is about even with a top surface of the top IMD layer 904$imd'$. The planarization forms a first electronic component 104 and also forms wires 112 and vias 302 in the top IMD layer 904$imd'$. The first electronic component 104 may, for example, be an inductor or some other suitable electronic component. The planarization may, for example, be performed by a chemical mechanical polish (CMP) or some other suitable planarization.

Also illustrated by the cross-sectional view 1700 of FIG. 17, a first etch stop layer 916 is formed over the top IMD layer 904$imd'$ and the first electronic component 104.

Figure 18:
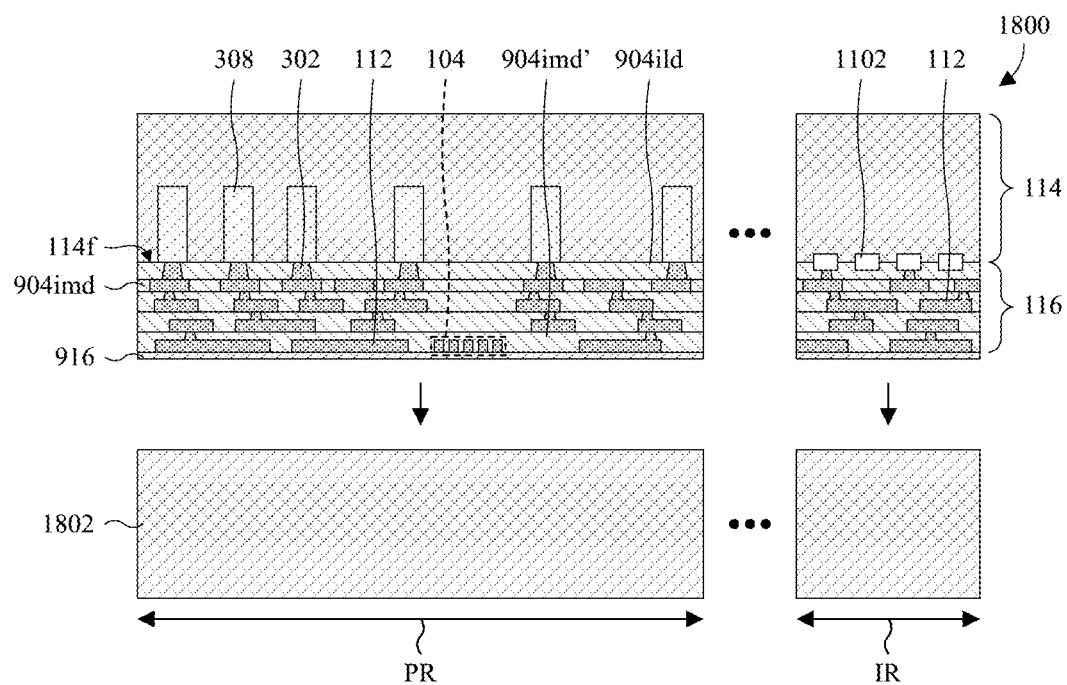

As illustrated by the cross-sectional view 1800 of FIG. 18, the structure of FIG. 17 is flipped vertically and bonded to a carrier substrate 1802. The carrier substrate 1802 may, for example, be a bulk silicon substrate or some other suitable substrate. The bonding may, for example, be performed by fusion bonding or some other suitable bonding.

Figure 19:
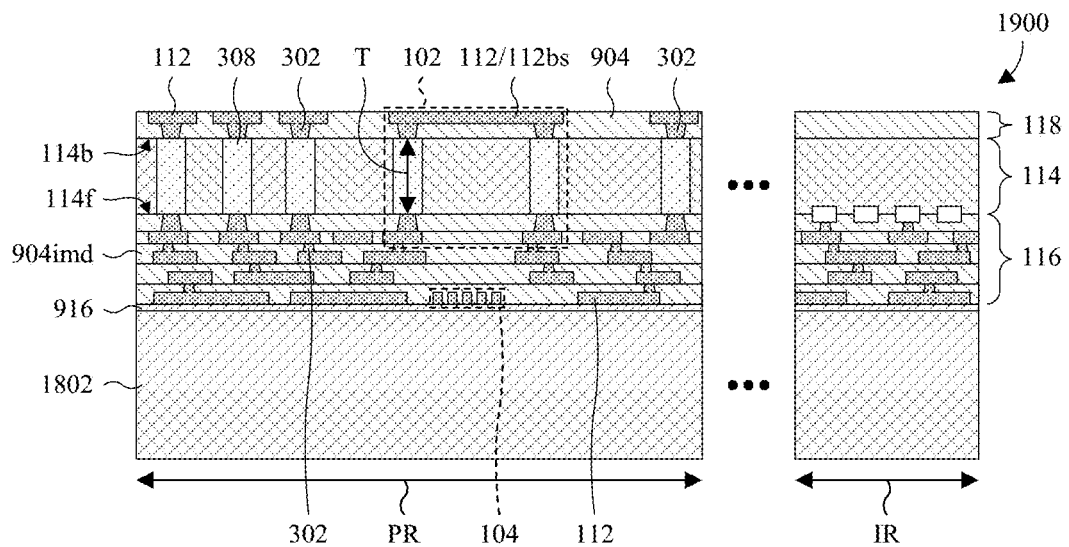

As illustrated by the cross-sectional view 1900 of FIG. 19, the first substrate 114 is thinned from a backside 114$b$ of the first substrate 114, opposite the frontside 114f of the first substrate 114. The thinning reduces a thickness T of the first substrate 114 and additionally exposes the doped channels 308. The thinning may, for example, be performed by a CMP or some other suitable planarization.

Also illustrated by the cross-sectional view 1900 of FIG. 19, a backside interconnect structure 118 is formed on the backside 114b of the first substrate 114. The backside interconnect structure 118 comprises an interconnect dielectric layer 904, and further comprises a plurality of wires 112 and a plurality of vias 302. The wires 112 and the vias 302 are stacked and define conductive paths leading from the doped channels 308. While only one level of wires and one level of vias is shown in the backside interconnect structure 118, additional levels of vias and/or additional levels of wires are amenable in alternative embodiments.

In some embodiments (as illustrated), the backside interconnect structure 118 is formed by a dual damascene process. In alternative embodiments, the illustrated wire level and the illustrated via level are individually formed by a single damascene process. Non-limiting examples of the dual and single damascene processes are described with regard to FIG. 13. Notwithstanding the aforementioned processes for forming the backside interconnect structure 118, other processes are, however, amenable.

Upon completion of the backside interconnect structure 118, a shield structure 102 resides directly over the first electronic component 104. The shield structure 102 comprises a backside shield wire 112bs and may, for example, be as described with regard to FIG. 3B. Further, the shield structure 102 and the first electronic component 104 may, for example, have top layouts as shown in any one of FIGS. 2, 5, and 7. Other top layouts are, however, amenable. As discussed in greater detail, the backside shield wire 112bs and hence the shield structure 102 are configured to block magnetic and/or electric fields from the first electronic component 104 from disturbing an overlying electronic component (not shown).

Figure 20:
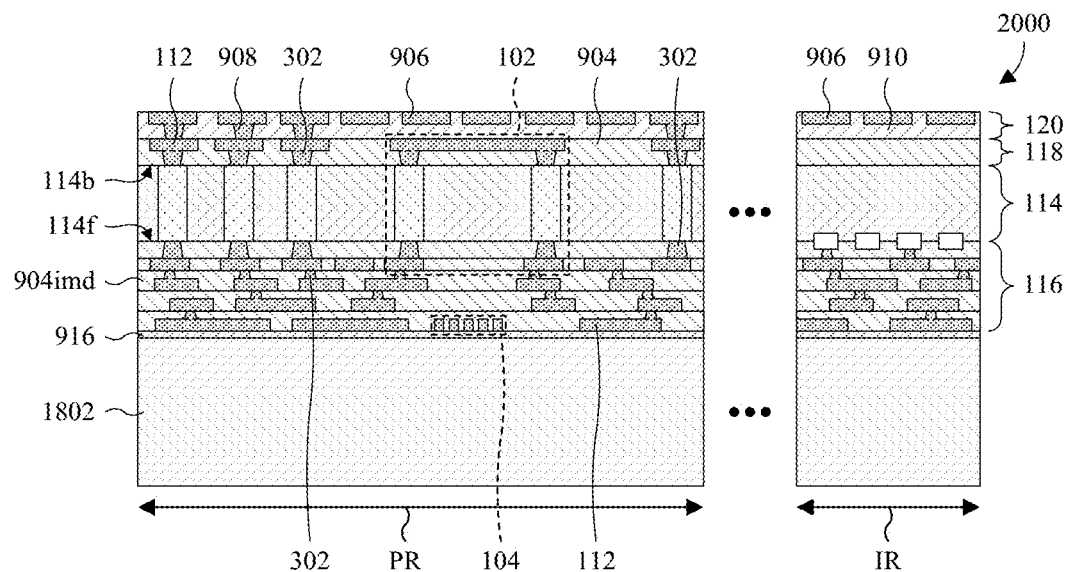

As illustrated by the cross-sectional view 2000 of FIG. 20, a first bond structure 120 is formed on the backside interconnect structure 118. The first bond structure 120 comprises a bond dielectric layer 910, and further comprises bond pads 906 and bond contacts 908 stacked in the bond dielectric layer 910. The bond contacts 908 extend from the bond pads 906 to the wires 112 in the backside interconnect structure 118 to provide electrical coupling between the first bond structure 120 and the backside interconnect structure 118. The first bond structure 120 may, for example, be formed according to any one of the processes described above for forming the backside interconnect structure 118 or according to any other suitable process.

Figure 21:
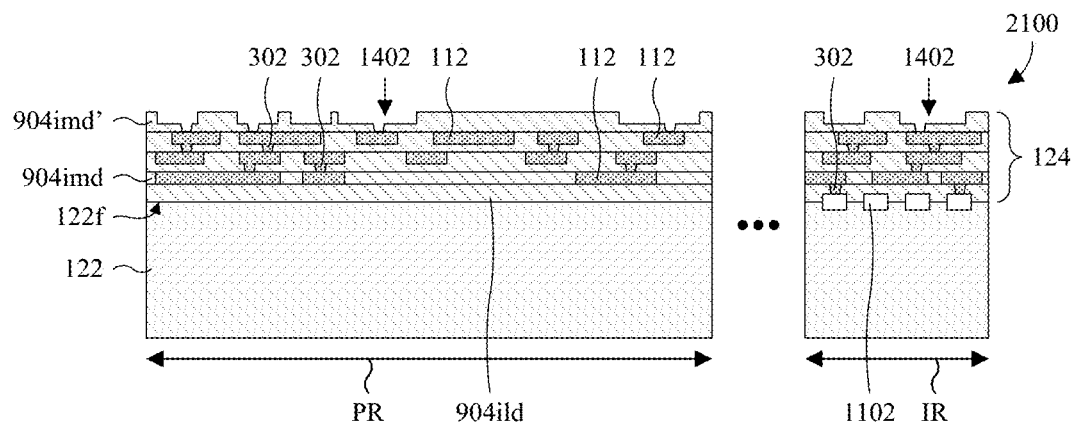

As illustrated by the cross-sectional view 2100 of FIG. 21, semiconductor devices 1102 are formed on a frontside 122f of a second substrate 122. The semiconductor devices 1102 are formed at the interior region IR of the 3DIC being formed and may, for example, be MOSFETs and/or some other suitable semiconductor devices.

Also illustrated by the cross-sectional view 2100 of FIG. 21, a second frontside interconnect structure 124 is partially formed on the frontside 122f of the second substrate 122. The second frontside interconnect structure 124 may, for example, be as the first frontside interconnect structure 116 is illustrated and/or described, except for a different arrangement of wires and vias. Further, the second frontside interconnect structure 124 may, for example, be formed according to the acts at FIGS. 13 and 14.

Figure 22:
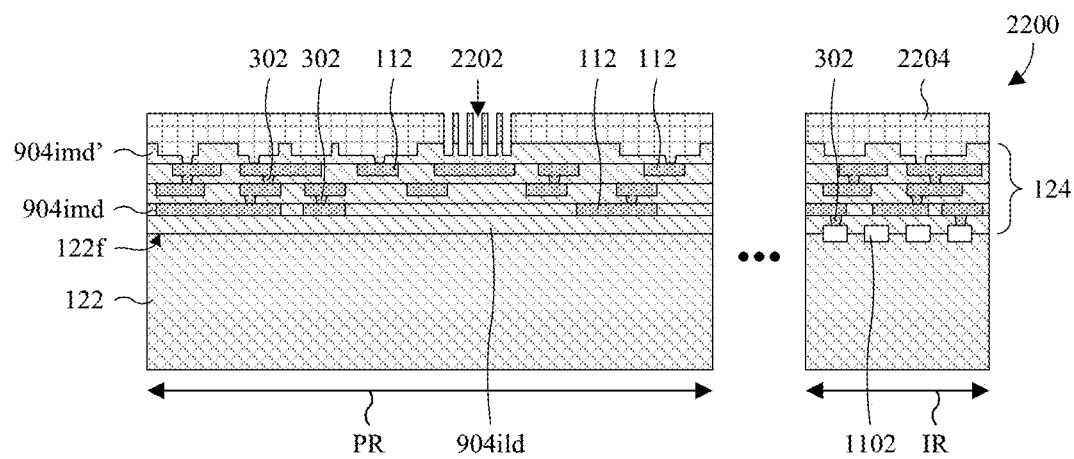

As illustrated by the cross-sectional view 2200 of FIG. 22, the top IMD layer 904imd' is patterned to form a second electronic component opening 2202. Note that while the second electronic component opening 2202 is shown as being formed after the interconnect openings 1402 of FIG. 21, the second electronic component opening 2202 may be formed before the interconnect openings 1402 of FIG. 21 in alternative embodiments. The second electronic component opening 2202 may, for example, correspond to an inductor or some other suitable electronic device being formed. The second electronic component opening 2202 may, for example, have the same top layout as the second electronic component opening 2202 in any one of FIG. 2, 5, or 7. Other top layouts are, however, amenable.

In some embodiments, a process for forming the second electronic component opening 2202 comprise: 1) forming a mask 2204 over the top IMD layer 904imd'; 2) performing an etch into the top IMD layer 904imd' with the mask 2204 in place; and 3) removing the mask 2204. Other processes are, however, amenable. The mask 2204 may, for example, be or comprise photoresist and/or a hard mask material. In some embodiments, the mask 2204 is photoresist that is patterned by photolithography using the same photoreticle or photomask used to pattern the mask 1404 of FIG. 14. A photoreticle or photomask is expensive, such that reusing a photoreticle or photomask is a substantial cost savings.

Figure 23:
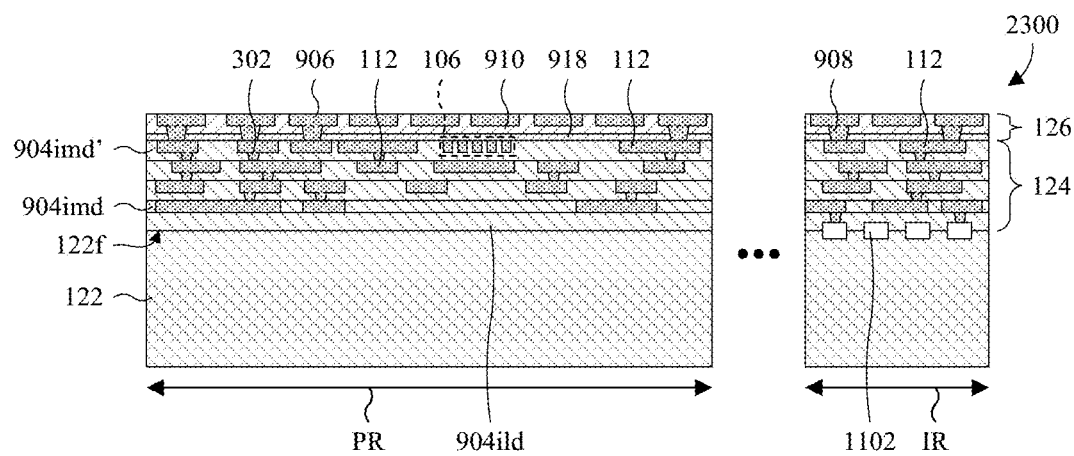

As illustrated by the cross-sectional view 2300 of FIG. 23, a second electronic component 106 is formed in the second electronic component opening 2202. Further, wires 112 and vias 302 are formed in the interconnect openings 1402 of FIG. 21. The second electronic component 106 may, for example, be an inductor or some other suitable electronic component. In some embodiments, the second electronic component 106 is the same type of electronic component as the first electronic component 104 of FIG. 17 and/or has a same top layout as the first electronic component 104 of FIG. 17.

In some embodiments, a process for forming the second electronic component 106, the wires 112, and the vias 302 comprises: 1) depositing a conductive layer in the second electronic component opening 2202 of FIG. 22 and the interconnect openings 1402 of FIG. 21; and 2) performing a planarization into the conductive layer until a top surface of the conductive layer is about even with a top surface of the top IMD layer 904imd'. An example of this process is illustrated and/or described with regard to FIGS. 16 and 17 and, in alternative embodiments, other suitable processes may be used.

Also illustrated by the cross-sectional view 2300 of FIG. 23, a second etch stop layer 918 and a second bond structure 126 are formed over the top IMD layer 904imd' and the second electronic component 106. The second bond structure 126 overlies the second etch stop layer 918 and protrudes through the second etch stop layer 918 to electrically coupled with the second frontside interconnect structure 124. The second bond structure 126 may, for example, be formed as illustrated and/or described for the first bond structure 120 of FIG. 20. Further, in some embodiments, a layout of the bond pads 906 in the second bond structure 126 matches a layout of the bond pads 906 in the first bond structure 120.

Figure 24:
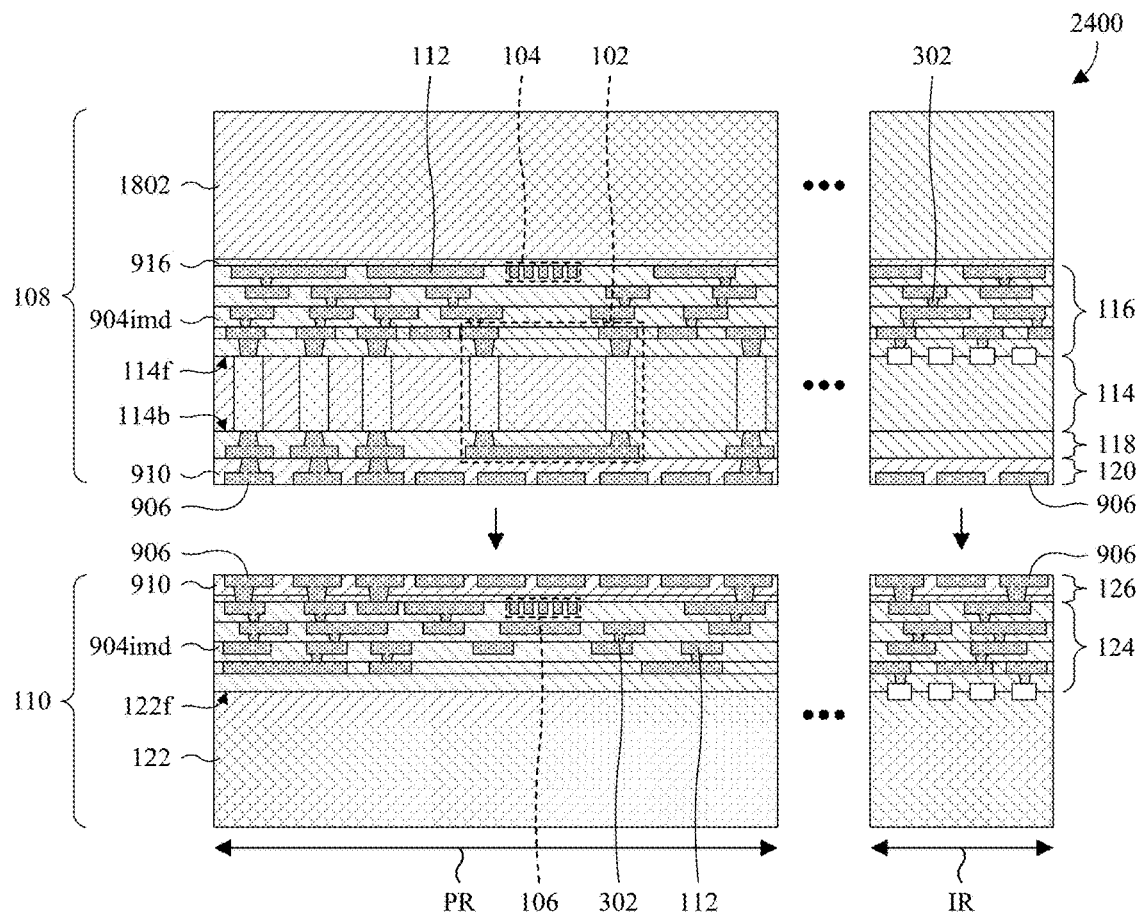

As illustrated by the cross-sectional view 2400 of FIG. 24, the structure of FIG. 20 (also known as a first IC chip 108) is flipped vertically and bonded to the structure of FIG. 23 (also known as a second IC chip 110). The bonding is performed by hybrid bonding, such that bonding occurs at an interface at which the bond pads 906 of the first and second bond structures 120, 126 directly contact and at an interface at which the bond dielectric layers 910 of the first and second bond structures 120, 126 directly contact. In alternative embodiments, some other type of bonding and/or bond structures may be employed.

The bonding is performed so that the backside 114b of the first substrate 114 and the frontside 122f of the second substrate 122 face each other. In other words, the bonding is frontside-to-backside bonding. Further, the bonding is performed so that the first electronic component 104 directly overlies the shield structure 102 and the second electronic component 106. The first electronic component 104 may, for example, directly overlie the second electronic component 106 due to the frontside-to-backside bonding at least when the same photoreticle or photomask is used to form the first and second electronic components 104, 106.

Because the shield structure 102 is directly between the first and second electronic components 104, 106, the shield structure 102 blocks magnetic and/or electric fields from passing from the first electronic component 104 to the second electronic component 106 and vice versa. Absent the shield structure 102, the magnetic and/or electric fields from the first electronic component 104 may, for example, cause noise and/or other disturbances at the second electronic components 106 and vice versa. Disturbances at the first and second electronic components 104, 106 may, in turn, negatively impact operation of the 3DIC. For example, the disturbances may transfer to a remainder of the 3DIC, thereby shifting operating parameters of the 3DIC out of specification and/or otherwise degrade performance of the 3DIC.

Figure 25:
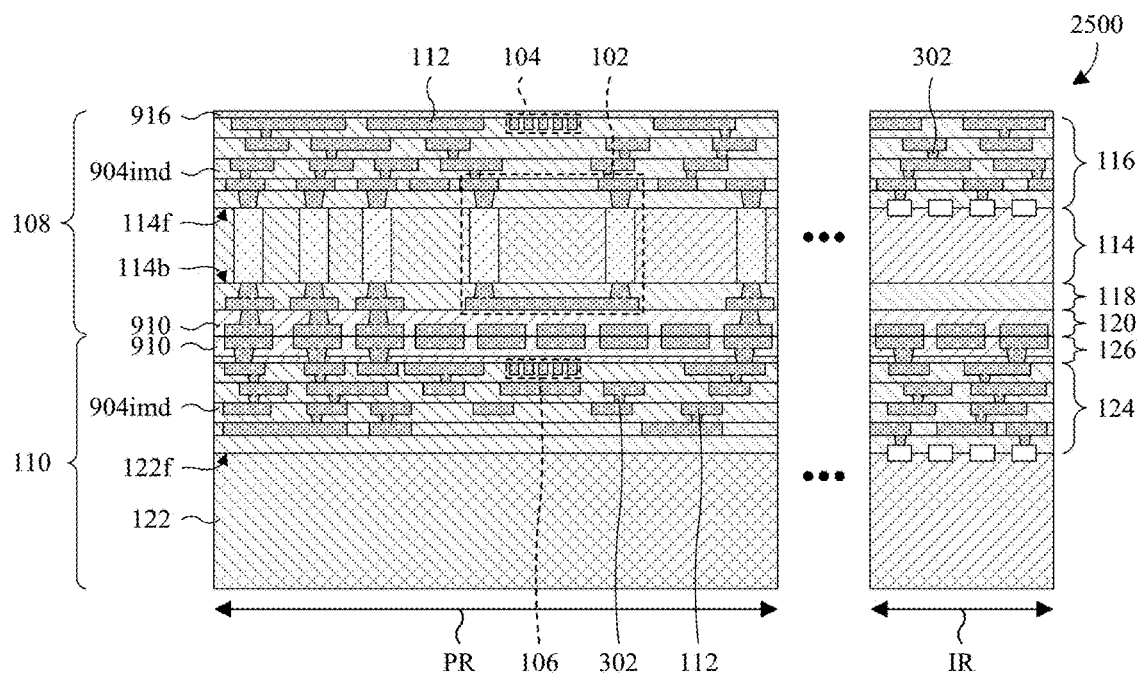

As illustrated by the cross-sectional view 2500 of FIG. 25, the carrier substrate 1802 of FIG. 24 is removed from the frontside 114f of the first substrate 114, thereby exposing the first etch stop layer 916. The removal may, for example, be performed by a grinding process, a CMP, an etch back, some other suitable removal process, or any combination of the foregoing.

Figure 26:
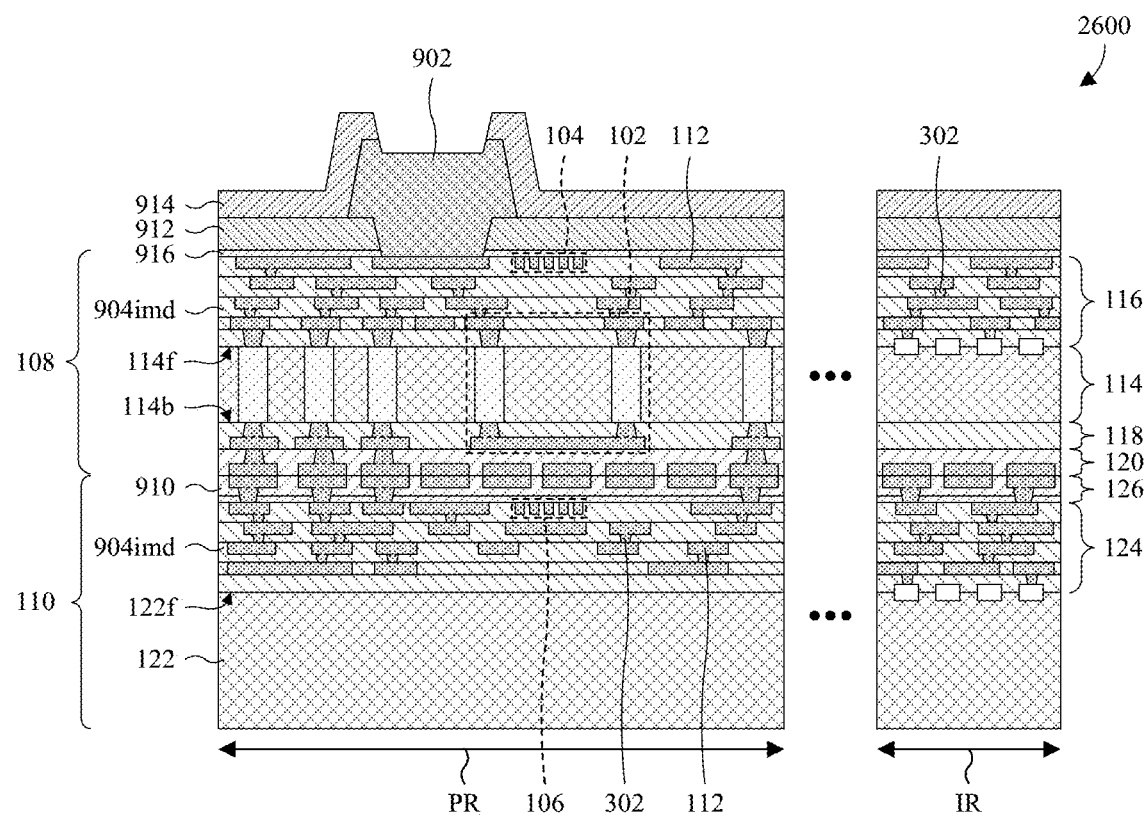

As illustrated by the cross-sectional view 2600 of FIG. 26, a first passivation layer 912 is deposited over the first frontside interconnect structure 116. A pad structure 902 is formed over the first passivation layer 912 and protrudes through the first passivation layer 912 to a wire 112 in the first frontside interconnect structure 116. A second passivation layer 914 is deposited over the first passivation layer 912 and the pad structure 902 and is subsequently patterned to at least partially expose a top surface of the pad structure 902.

While FIGS. 12-26 are described with reference to a method, it will be appreciated that the structures shown in FIGS. 12-26 are not limited to the method but rather may stand alone separate of the method. While FIGS. 12-26 are described as a series of acts, it will be appreciated that the order of the acts may be altered in other embodiments. While FIGS. 12-26 are illustrated and described as a specific set of acts, some acts that are illustrated and/or described may be omitted in other embodiments. Further, acts that are not illustrated and/or described may be included in other embodiments. By omitting and/or adding acts, alternative embodiments of the method may form the 3DIC with the shield structure 102 in any one of FIGS. 1, 3A, 3C, 4, 6, 8A-8C, 9, and 10A-10C. For example, by at least omitting formation of TSVs 304 at the shield structure 102, the method may form the 3DIC with the shield structure 102 of FIG. 1.

Figure 27:
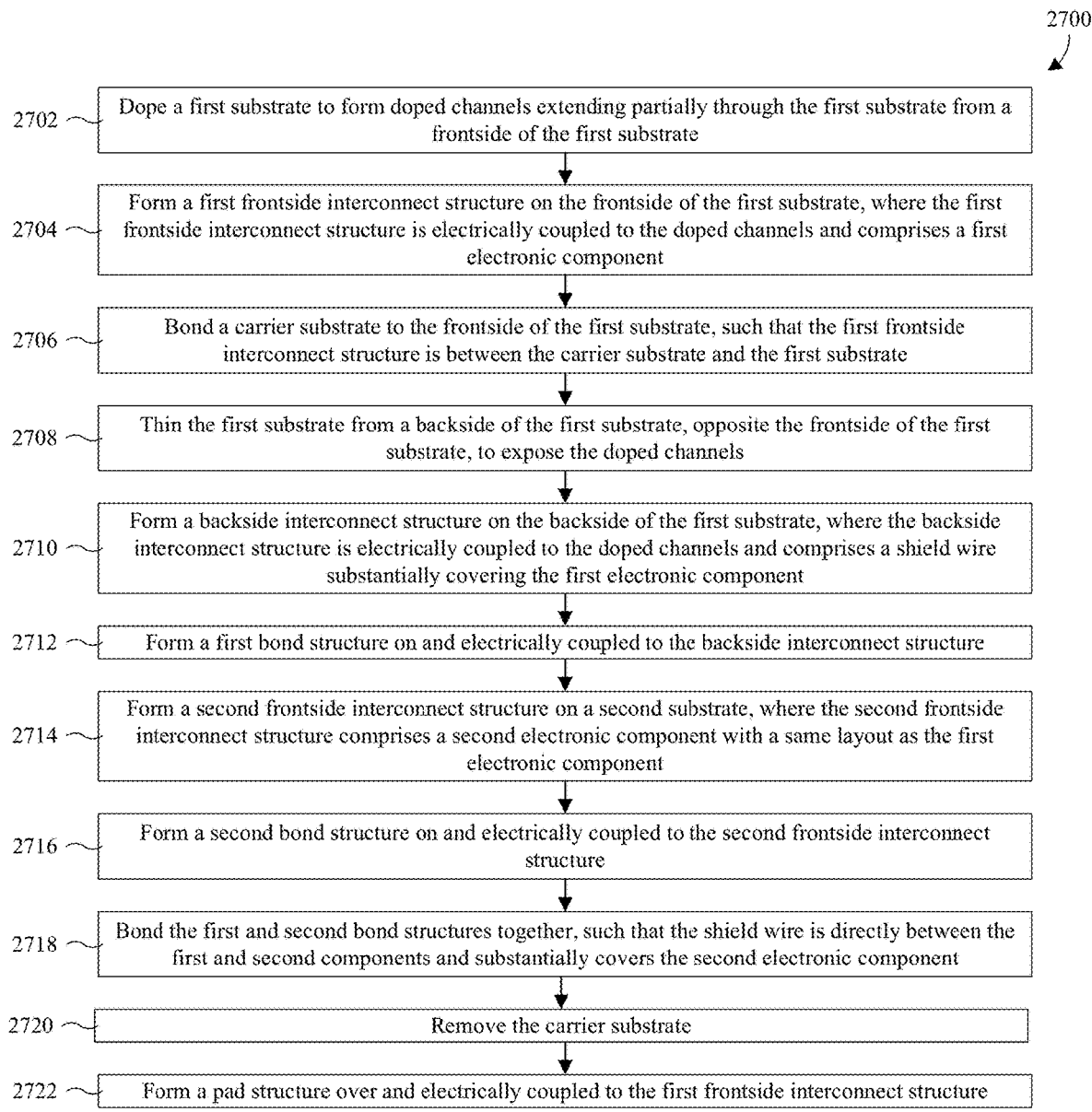
FIG. 27 illustrates a block diagram of some embodiments of the method of FIGS. 12-26.

With reference to FIG. 27, a block diagram 2700 of some embodiments of the method of FIGS. 12-26 is provided.

At 2702, a first substrate is doped to form doped channels extending partially through the first substrate from a frontside of the first substrate. See, for example, FIG. 12.

At 2704, a first frontside interconnect structure is formed on the frontside of the first substrate, where the first frontside interconnect structure is electrically coupled to the doped channels and comprises a first electronic component. See, for example, FIGS. 13-17.

At 2706, a carrier substrate is bonded to the frontside of the first substrate, such that the first frontside interconnect structure is between the carrier substrate and the first substrate. See, for example, FIG. 18.

At 2708, the first substrate is thinned from a backside of the first substrate, opposite the frontside of the first substrate, to expose the doped channels. See, for example, FIG. 19.

At 2710, a backside interconnect structure is formed on the backside of the first substrate, where the backside interconnect structure is electrically coupled to the doped channels and comprises a shield wire completely covering the first electronic component. See, for example, FIG. 19.

At 2712, a first bond structure is formed on and electrically coupled to the backside interconnect structure. See, for example, FIG. 20.

At 2714, a second frontside interconnect structure is formed on a second substrate, where the second frontside interconnect structure comprises a second electronic component with a same layout as the first electronic component. See, for example, FIGS. 21-23. The first and second electronic components may be, for example, inductors or some other suitable electronic components. Further, the first and second electronic components may, for example, be formed using the same photoreticle or photomask to reduce costs.

At 2716, a second bond structure is formed on and electrically coupled to the second frontside interconnect structure. See, for example, FIG. 23.

At 2718, the first and second bond structures are bonded together, such that the shield wire is directly between the first and second electronic components and substantially (or completely) covers the second electronic component. See, for example, FIG. 24.

At 2720, the carrier substrate is removed. See, for example, FIG. 25.

At 2722, a pad structure is formed over and electrically coupled to the first frontside interconnect structure. See, for example, FIG. 26.

While the block diagram 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 28-36, a series of cross-sectional views 2800-3600 of some embodiments of a method for forming a 3DIC (or a semiconductor packaging device) is provided in which a shield structure comprises a backside shield wire and a doped shield directly between electronic components. The 3DIC being formed may, for example, correspond to the 3DIC of FIG. 11B.

Figure 28:
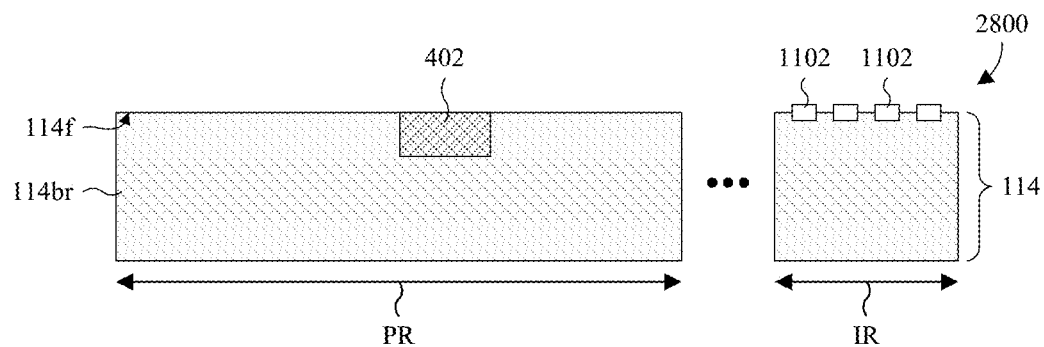
FIGS. 28-36 illustrate a series of cross-sectional views of some embodiments of a method for forming a 3DIC in which a shield structure comprises a doped shield region of a substrate and a shield wire both directly between electronic components.

As illustrated by the cross-sectional view 2800 of FIG. 28, a first substrate 114 is doped from a frontside 114f of the first substrate 114 to form a doped shield 402 at a peripheral region PR of the 3DIC being formed. The doped shield 402 extends partially through the first substrate 114 and is a doped region of the first substrate 114 having an opposite doping type as a bulk region 114br of the first substrate 114. For example, the doped shield 402 may be N-type and the bulk region 114br may be P-type or vice versa. In some embodiments, a process for forming the doped shield 402 comprises: 1) forming a mask (not shown) on the frontside 114f of the first substrate 114; 2) implanting dopants into the frontside 114f of the first substrate 114 with the mask in place; and 3) removing the mask. The mask may, for example, be or comprise photoresist and/or a hard mask material.

Also illustrated by the cross-sectional view 2800 of FIG. 28, semiconductor devices 1102 are formed on the frontside 114f of the first substrate 114, at an interior region IR of the 3DIC being formed.

Figure 29:
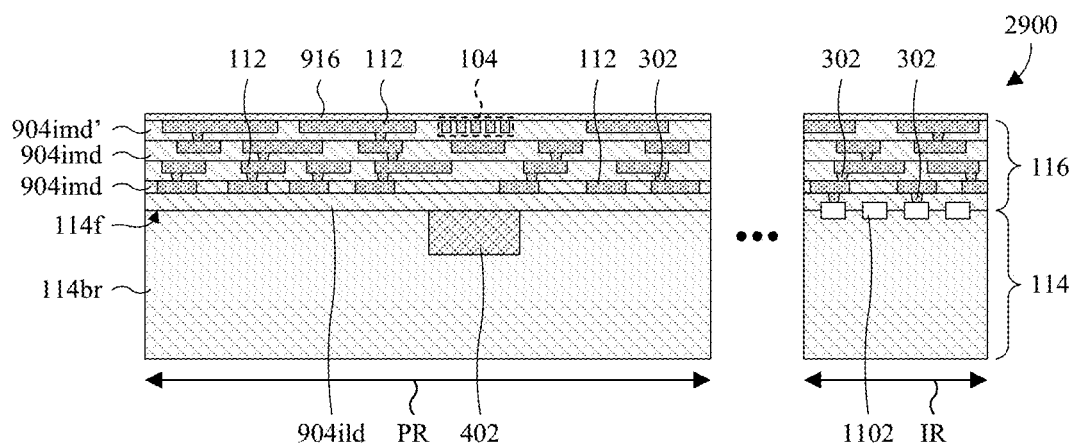

As illustrated by the cross-sectional view 2900 of FIG. 29, a first frontside interconnect structure 116, a first electronic component 104, and a first etch stop layer 916 are formed on the frontside 114f of the first substrate 114. The first electronic component 104 is formed while a top wire level of the first frontside interconnect structure 116 is formed and is formed directly over the doped shield 402. The first etch stop layer 916 is formed over the first frontside interconnect structure 116 and the first electronic component 104. The first frontside interconnect structure 116, the first electronic component 104, and the first etch stop layer 916 may, for example, be as described and/or formed as described at FIGS. 13-17.

Figure 30:
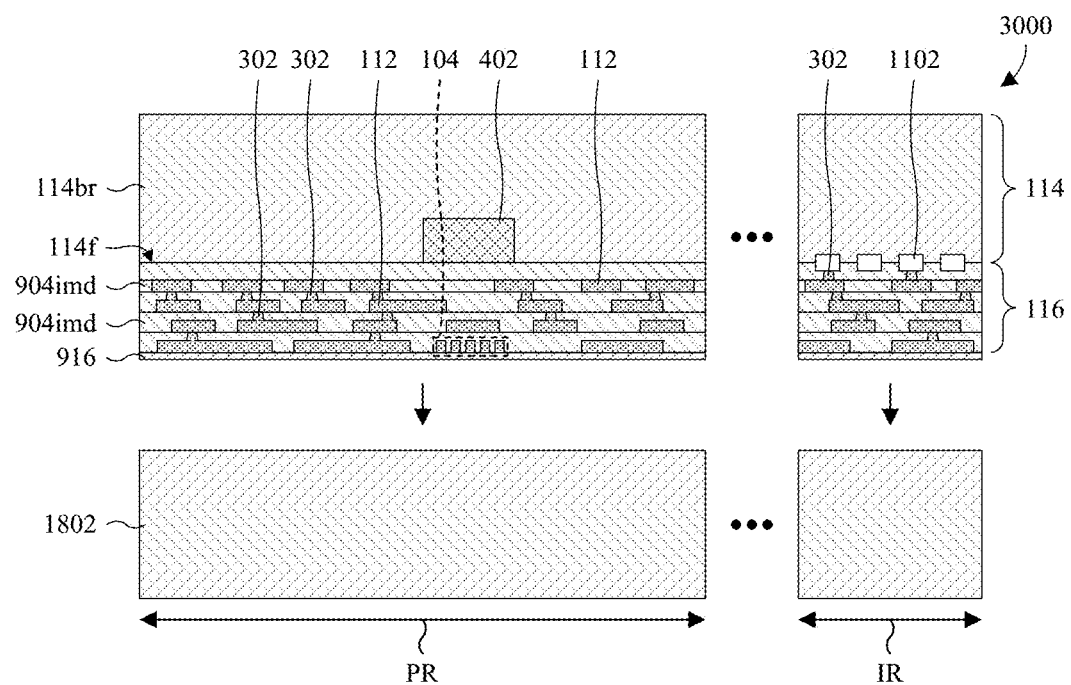

As illustrated by the cross-sectional view 3000 of FIG. 30, the structure of FIG. 29 is flipped vertically and bonded to a carrier substrate 1802. The bonding may, for example, be performed by fusion bonding or some other suitable bonding.

Figure 31:
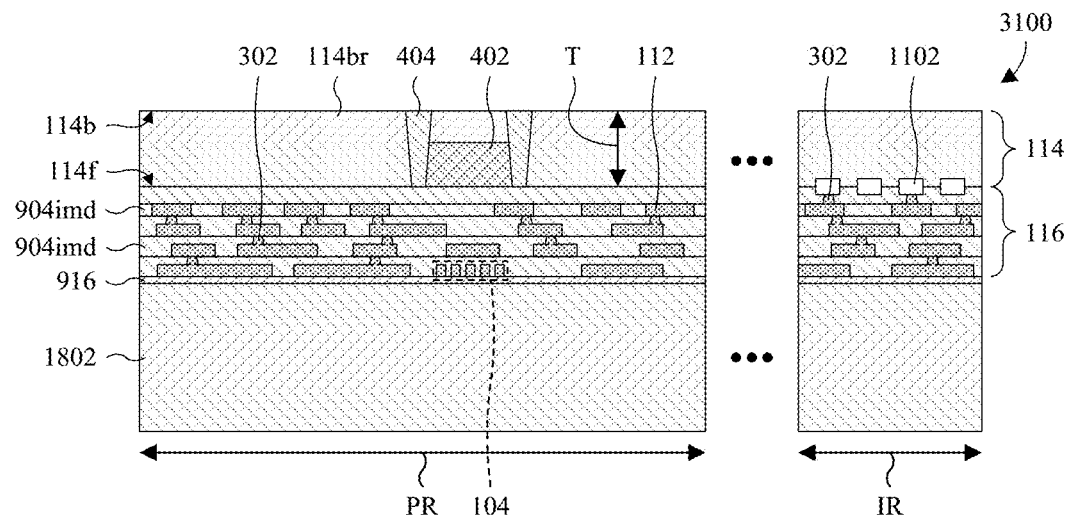

As illustrated by the cross-sectional view 3100 of FIG. 31, the first substrate 114 is thinned from a backside 114b of the first substrate 114, opposite the frontside 114f of the first substrate. The thinning reduces a thickness T of the first substrate 114 and may, for example, be performed by a CMP or some other suitable planarization.

Also illustrated by the cross-sectional view 3100 of FIG. 31, a shield isolation structure 404 is formed extending through the first substrate 114 and surrounding the doped shield 402. The shield isolation structure 404 electrically isolates the doped shield 402 from portions of the first substrate 114 to sides of the doped shield 402 and may be or comprise, for example, a dielectric and/or some other suitable material(s). In some embodiments, a process for forming the shield isolation structure 404 comprises: 1) patterning the backside 114b of the first substrate 114 to form a trench with a layout of the shield isolation structure 404; 2) depositing a dielectric layer in the trench; and 3) performing a planarization into the dielectric layer until a top surface of the dielectric layer is even with a top surface of the first substrate 114.

Figure 32:
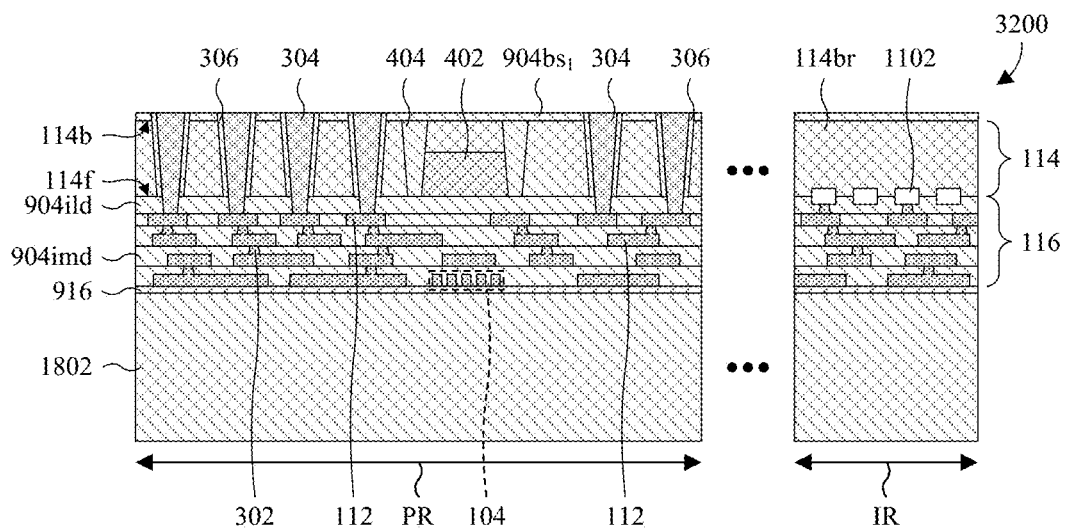

As illustrated by the cross-sectional view 3200 of FIG. 32, a first backside interconnect dielectric layer 904$bs_1$ is formed covering the shield isolation structure 404 on the backside 114b of the first substrate 114. Further, TSVs 304 and via dielectric layers 306 are formed extending through the first backside interconnect dielectric layer 904$bs_1$ and the first substrate 114. The via dielectric layers 306 electrically separate the TSVs 304 from the first substrate 114, and the TSVs 304 extend beyond the via dielectric layers 306 to wires 112 in the first frontside interconnect structure 116.

In some embodiments, a process for forming the TSVs 304 and the via dielectric layers 306 comprises: 1) patterning the first backside interconnect dielectric layer 904$bs_1$ and the first substrate 114 to form via openings; 2) depositing a dielectric layer lining the via openings; 3) etching back the dielectric layer to form the via dielectric layers 306; 4) performing an etch into the first frontside interconnect structure 116 to extend the via openings to wires 112 in the first frontside interconnect structure 116; 5) depositing a conductive layer filling a remainder of the via openings; and 6) performing a planarization into the conductive layer to form the TSVs 304. Other processes are, however, amenable in other embodiments.

Figure 33:
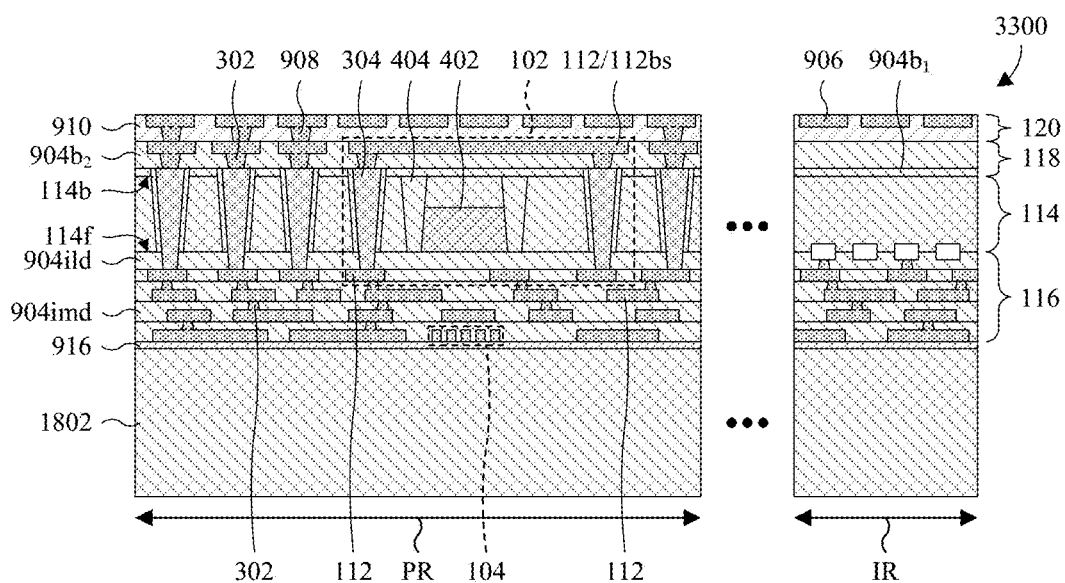

As illustrated by the cross-sectional view 3300 of FIG. 33, a backside interconnect structure 118 and a first bond structure 120 are formed covering the first backside interconnect dielectric layer 904$bs_1$ on the backside 114b of first substrate 114. The backside interconnect structure 118 may, for example, be as described and/or formed as described at FIG. 19, except that the wires 112 and the vias 302 of the backside interconnect structure 118 are formed in a second backside interconnect dielectric layer 904$bs_2$. The first bond structure 120 may, for example, be as described and/or formed as described at FIG. 20.

Upon completion of the backside interconnect structure 118, a shield structure 102 resides directly over the first electronic component 104. The shield structure 102 comprises the doped shield 402 in the first substrate 114 and further comprises a backside shield wire 112bs in the backside interconnect structure 118. The shield structure 102 may, for example, be as described with regard to FIG. 8A. Further, the shield structure 102 and the first electronic component 104 may, for example, have top layouts as shown in FIG. 7. Other top layouts are, however, amenable. In alternative embodiments, the doped shield 402 is not formed and the shield structure 102 is limited to the backside shield wire 112bs for blocking magnetic and/or electric fields. A non-limiting example of such a shield structure is at FIG. 3A. In alternative embodiments, the backside shield wire 112bs is not formed and the shield structure 102 is limited to doped shield 402 for blocking magnetic and/or electric fields. A non-limiting example of such a shield structure is at FIG. 4.

Figure 34:
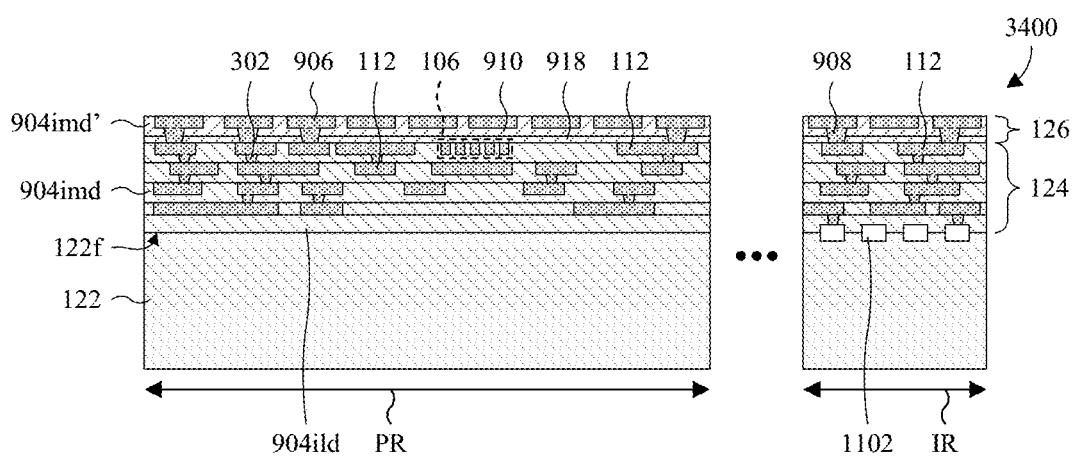

As illustrated by the cross-sectional view 3400 of FIG. 34, at least semiconductor devices 1102, a second frontside interconnect structure 124, a second electronic component 106, a second etch stop layer 918, and a second bond structure 126 are formed stacked on a frontside 122f of a second substrate 122. The semiconductor devices 1102, the second frontside interconnect structure 124, the second electronic component 106, the second etch stop layer 918, and the second bond structure 126 may, for example, be as described at and/or formed as described at FIGS. 21-23.

Figure 35:
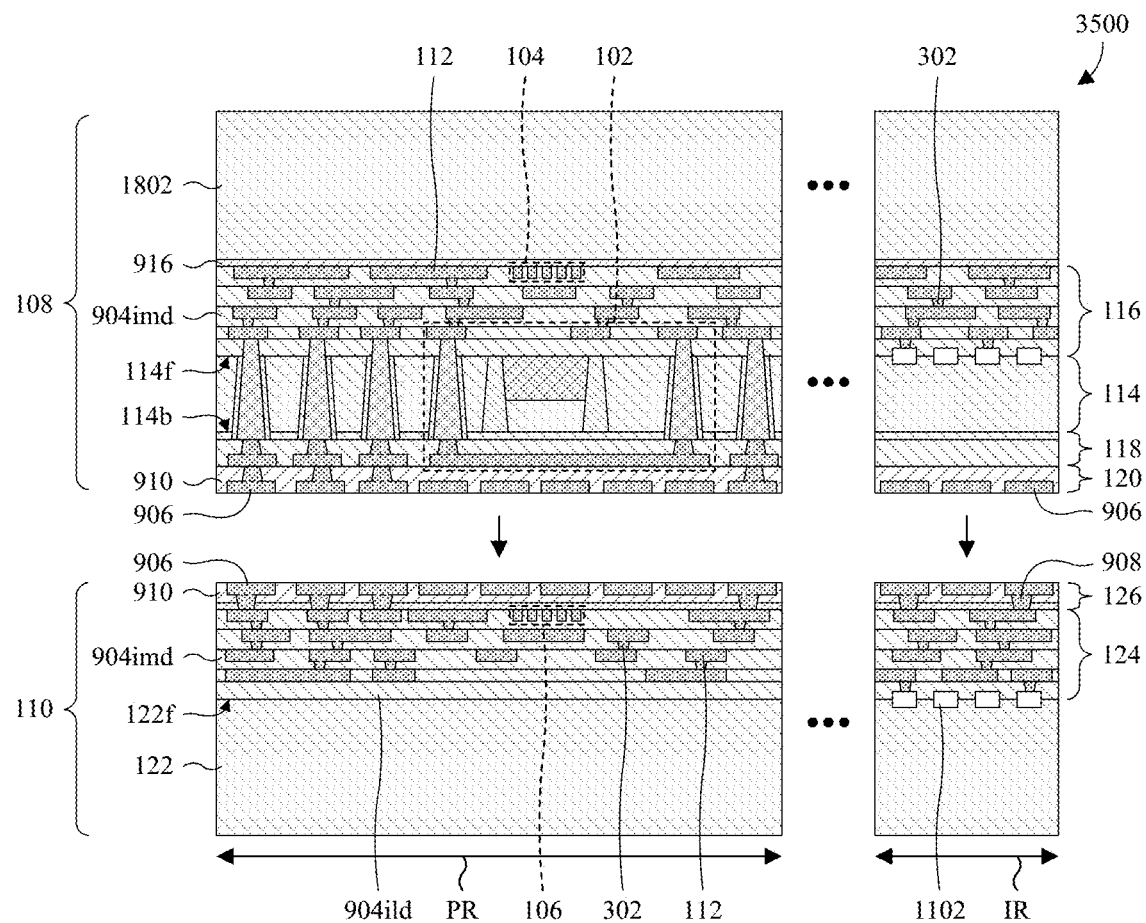

As illustrated by the cross-sectional view 3500 of FIG. 35, the structure of FIG. 33 (also known as a first IC chip 108) is flipped vertically and bonded to the structure of FIG. 34 (also known as a second IC chip 110). The bonding is performed so the backside 114b of the first substrate 114 and the frontside 122f of the second substrate 122 face each other. Further, the bonding is performed so the first electronic component 104 directly overlies the shield structure 102 and the second electronic component 106. Because the shield structure 102 is directly between the first and second electronic components 104, 106, the shield structure 102 blocks magnetic and/or electric fields from passing between the first and second electronic components 104, 106. The bonding may, for example, be performed as described at FIG. 24.

Figure 36:
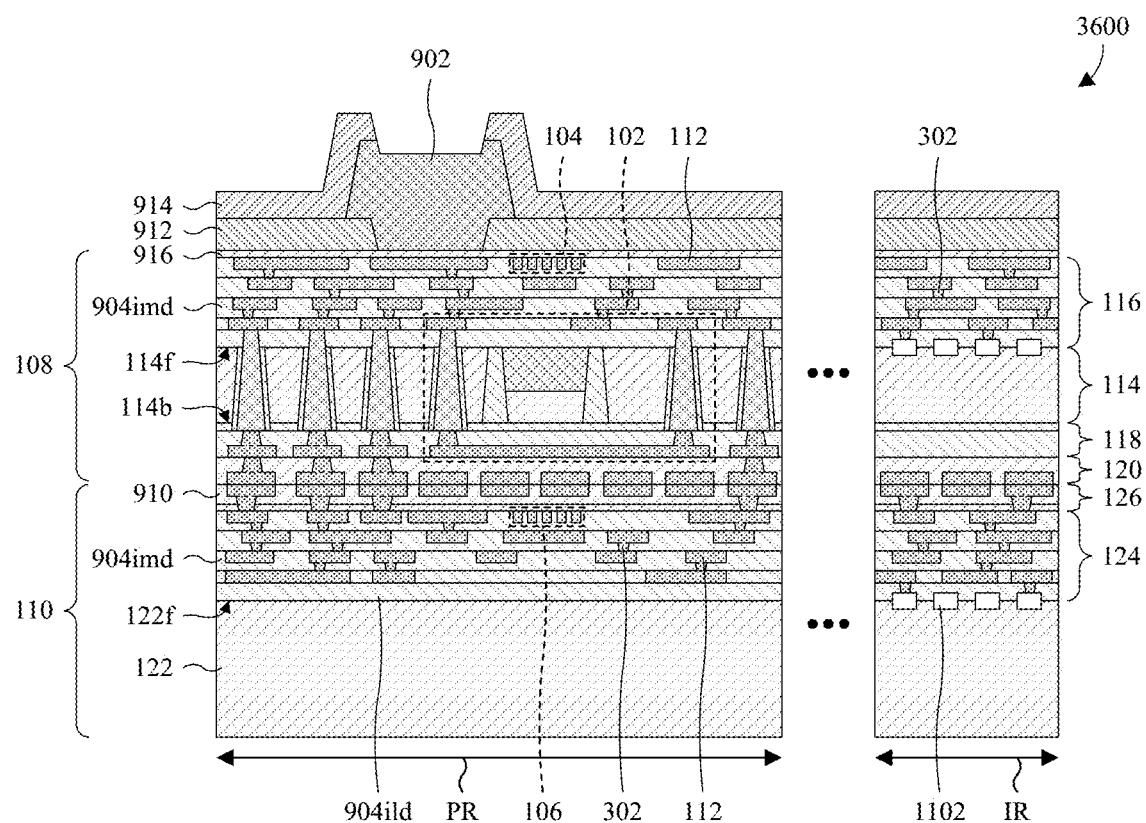

As illustrated by the cross-sectional view 3600 of FIG. 36, the carrier substrate 1802 of FIG. 35 is removed from the frontside 114f of the first substrate 114, thereby exposing the first etch stop layer 916. Further, a first passivation layer 912, a pad structure 902, and a second passivation layer 914 are formed on the first etch stop layer 916. The removal and the forming may, for example, be as described at FIGS. 25 and 26.

While FIGS. 28-36 are described with reference to a method, it will be appreciated that the structures shown in FIGS. 28-36 are not limited to the method but rather may stand alone separate of the method. While FIGS. 28-36 are described as a series of acts, it will be appreciated that the order of the acts may be altered in other embodiments. While FIGS. 28-36 are illustrated and described as a specific set of acts, some acts that are illustrated and/or described may be omitted in other embodiments. Further, acts that are not illustrated and/or described may be included in other embodiments. By omitting and/or adding acts, alternative embodiments of the method may form the 3DIC with the shield structure 102 in any one of FIGS. 1, 3A-3C, 4, 6, 8B, and 8C. For example, by at least omitting formation of doped channels 308 at the shield structure 102, the method may form the 3DIC with the shield structure 102 of FIG. 6.

Figure 37:
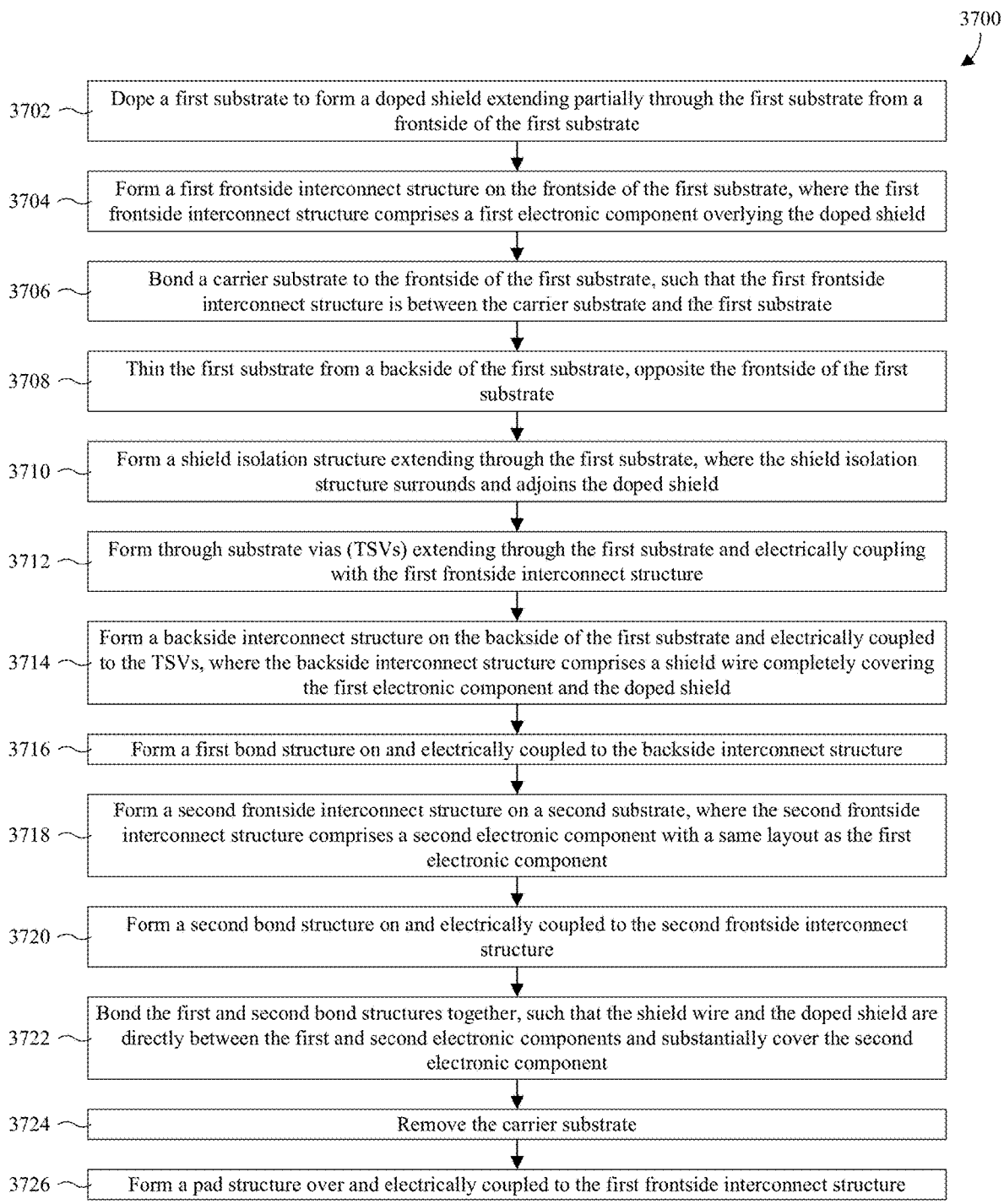
FIG. 37 illustrates a block diagram of some embodiments of the method of FIGS. 28-36.

With reference to FIG. 37, a block diagram 3700 of some embodiments of the method of FIGS. 28-36 is provided.

At 3702, a first substrate is doped to form a doped shield extending partially through the first substrate from a frontside of the first substrate. See, for example, FIG. 28.

At 3704, a first frontside interconnect structure is formed on the frontside of the first substrate, where the first frontside interconnect structure comprises a first electronic component overlying the doped shield. See, for example, FIG. 29.

At 3706, a carrier substrate is bonded to the frontside of the first substrate, such that the first frontside interconnect structure is between the carrier substrate and the first substrate. See, for example, FIG. 30.

At 3708, the first substrate is thinned from a backside of the first substrate, opposite the frontside of the first substrate. See, for example, FIG. 31.

At 3710, a shield isolation structure is formed extending through the first substrate, where the shield isolation structure surrounds and adjoins the doped shield. See, for example, FIG. 31.

At 3712, TSVs are formed extending through the first substrate and electrically coupled with the first frontside interconnect structure. See, for example, FIG. 32.

At 3714, a backside interconnect structure is formed on the backside of the first substrate and electrically coupled to the TSVs, where the backside interconnect structure comprises a shield wire substantially (or completely) covering the first electronic component and the doped shield. See, for example, FIG. 33.

At 3716, a first bond structure is formed on and electrically coupled to the backside interconnect structure. See, for example, FIG. 33.

At 3718, a second frontside interconnect structure is formed on a second substrate, where the second frontside interconnect structure comprises a second electronic component with a same layout as the first electronic component. See, for example, FIG. 34.

At 3720, a second bond structure is formed on and electrically coupled to the second frontside interconnect structure. See, for example, FIG. 34.

At 3722, the first and second bond structures are bonded together, such that the shield wire and the doped shield are directly between the first and second electronic components and substantially (or completely) cover the second electronic component. See, for example, FIG. 35.

At 3724, the carrier substrate is removed. See, for example, FIG. 36.

At 3726, a pad structure is formed over and electrically coupled to the first frontside interconnect structure. See, for example, FIG. 36.

While the block diagram 3700 of FIG. 37 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a semiconductor packaging device including: a first IC chip including a first substrate and a first interconnect structure overlying the first substrate; a second IC chip underlying the first IC chip, wherein the second IC chip includes a second substrate and a second interconnect structure overlying the second substrate; a first electronic component and a second electronic component respectively in the first and second interconnect structures; and a shield structure directly between and spaced from the first and second electronic components, wherein the shield structure substantially covers the second electronic component and is configured to block magnetic and/or electric fields. In some embodiments, the first and second electronic components are inductors. In some embodiments, the first and second electronic components have a same top layout, wherein a sidewall of the first electronic component overlies and is aligned to a sidewall of the second electronic component. In some embodiments, the shield structure includes a conductive wire, wherein the conductive wire has a pair of wire sidewalls on opposite sides of the conductive wire when viewed in profile, and wherein the first and second electronic component are laterally between and laterally spaced from the wire sidewalls. In some embodiments, the shield structure includes: a TSV extending through the first substrate to a wire in the first interconnect structure; a shield wire below the first substrate and substantially covering the second electronic component; and a backside via extending from the shield wire to the through via. In some embodiments, the shield structure further includes: a trench isolation structure extending through the first substrate, wherein the first and second electronic components are laterally between the trench isolation structure and the through via; and a doped shield in the first substrate and having an opposite doping type as a bulk region of the first substrate, wherein the doped shield adjoins the trench isolation structure and substantially covers the second electronic component. In some embodiments, the shield structure further includes: a trench isolation structure extending into the first substrate, wherein the trench isolation structure includes a pair of isolation segments when viewed in cross section, and wherein the first and second electronic components are laterally between the isolation segments; and a doped shield in the first substrate, wherein the doped shield has an opposite doping type as a bulk region of the second substrate, and wherein the doped shield is between and adjoins the isolation segments. In some embodiments, a thickness of the doped shield is less than a thickness of the first substrate. In some embodiments, the shield structure includes: a doped channel in the first substrate and extending through the first substrate, from a bottom surface of the first substrate to a top surface of the first substrate; a frontside via in the first interconnect structure and extending from the doped channel to electrically couple the first interconnect structure to the doped channel; a shield wire below the first substrate and substantially covering the second electronic component; and a backside via extending from the shield wire to the doped channel.

In some embodiments, the present application provides a method for forming a semiconductor packaging device, the method including: forming a first frontside interconnect structure on a frontside surface of a first substrate, wherein the first frontside interconnect structure includes a first inductor; forming a backside interconnect structure on a backside surface of the first substrate, opposite the frontside surface, wherein the backside interconnect structure includes a shield wire directly over and greater in width than the first inductor; forming a second frontside interconnect structure on a second substrate, wherein the second frontside interconnect structure includes a second inductor; and bonding and electrically coupling the second frontside interconnect structure to the backside interconnect structure, wherein the shield wire is directly between the first and second inductors upon completion of the bonding. In some embodiments, the first and second inductors are formed using individual photolithography/etching processes, wherein the photolithography/etching processes use a same photoreticle or photomask. In some embodiments, the method further includes: doping the first substrate to form a doped shield region in the first substrate, wherein the first inductor is formed directly over the doped shield region; and forming a trench isolation structure extending into the backside surface of the first substrate, wherein the trench isolation structure has a pair of segments, and wherein the segments adjoin and are on respectively on opposite sides of the doped shield region. In some embodiments, the method further includes: bonding the first frontside interconnect structure to a carrier substrate, so the first frontside interconnect structure is between the carrier substrate and the first substrate; and planarizing the backside surface of the first substrate to thin the first substrate before the forming of the backside interconnect structure. In some embodiments, the method further includes doping the first substrate to form a doped channel region extending through the first substrate, wherein the first frontside interconnect structure is formed with a frontside via extending to the doped channel region, and wherein the backside interconnect structure is formed with a backside via extending from the shield wire to the doped channel region. In some embodiments, the method further includes forming a TSV extending through the first substrate to an interconnect wire in the first frontside interconnect structure, wherein the backside interconnect structure is formed with a backside via extending from the shield wire to the TSV.

In some embodiments, the present application provides another method for forming a semiconductor packaging device, the method including: doping a first substrate from a frontside of the first substrate to form a doped shield region in the first substrate; forming a first frontside interconnect structure on the frontside of the first substrate, wherein the first frontside interconnect structure includes a first electronic component directly over the doped shield region; forming an isolation structure extending into a backside of the first substrate, opposite the frontside of the first substrate, and having a pair of isolation segments, wherein the isolation segments adjoin and are respectively on opposite sides of the doped shield region; forming a second frontside interconnect structure on a second substrate, wherein the second frontside interconnect structure includes a second electronic component; and bonding the second frontside interconnect structure to the backside of the first substrate so the doped shield region is vertically between the first and second electronic components and the first and second electronic components are laterally between the isolation segments. In some embodiments, the method further includes: bonding a carrier substrate to the first frontside interconnect structure so the first frontside interconnect structure is between the carrier substrate and the first substrate; and thinning the first substrate from the backside of the first substrate. In some embodiments, the method further includes: forming a backside interconnect structure on the backside of the first substrate, wherein the backside interconnect structure includes a shield wire completely covering the doped shield region and the first electronic component. In some embodiments, the method further includes: forming TSVs extending into the backside of the first substrate to an interconnect wire of the first frontside interconnect structure, wherein the forming of the backside interconnect structure includes forming a backside via extending directly from the shield wire directly to the TSV. In some embodiments, the method further includes: forming a first hybrid bond structure on the backside of the first substrate, wherein the first hybrid bond structure is electrically coupled to the first frontside interconnect structure; and forming a second hybrid bond structure on the second frontside interconnect structure, wherein the second hybrid bond structure is electrically coupled to the second frontside interconnect structure, and wherein the bonding is performed by hybrid bonding and includes bringing the first and second hybrid bond structures into direct contact with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor packaging device, the method comprising:
   forming a first frontside interconnect structure on a frontside surface of a first substrate, wherein the first frontside interconnect structure comprises a first inductor;
   forming a backside interconnect structure on a backside surface of the first substrate, opposite the frontside surface, wherein the backside interconnect structure comprises a shield wire directly over and greater in width than the first inductor;
   forming a second frontside interconnect structure on a second substrate, wherein the second frontside interconnect structure comprises a second inductor; and
   bonding and electrically coupling the second frontside interconnect structure to the backside interconnect structure, wherein the shield wire is directly between the first and second inductors upon completion of the bonding.

2. The method according to claim 1, wherein the first and second inductors are formed using individual photolithography/etching processes, and wherein the photolithography/etching processes use a same photoreticle or photomask.

3. The method according to claim 1, further comprising:
doping the first substrate to form a doped shield region in the first substrate, wherein the first inductor is formed directly over the doped shield region; and
forming a trench isolation structure extending into the backside surface of the first substrate, wherein the trench isolation structure has a pair of segments, and wherein the segments adjoin and are on respectively on opposite sides of the doped shield region.

4. The method according to claim 1, further comprising:
bonding the first frontside interconnect structure to a carrier substrate, so the first frontside interconnect structure is between the carrier substrate and the first substrate; and
planarizing the backside surface of the first substrate to thin the first substrate before the forming of the backside interconnect structure.

5. The method according to claim 4, further comprising:
doping the first substrate to form a doped channel region extending through the first substrate, wherein the first frontside interconnect structure is formed with a frontside via extending to the doped channel region, and wherein the backside interconnect structure is formed with a backside via extending from the shield wire to the doped channel region.

6. The method according to claim 1, further comprising:
forming a through substrate via (TSV) extending through the first substrate to an interconnect wire in the first frontside interconnect structure, wherein the backside interconnect structure is formed with a backside via extending from the shield wire to the TSV.

7. A method for forming a semiconductor packaging device, the method comprising:
doping a first substrate from a frontside of the first substrate to form a doped shield region in the first substrate;
forming a first frontside interconnect structure on the frontside of the first substrate, wherein the first frontside interconnect structure comprises a first electronic component directly over the doped shield region;
forming an isolation structure extending into a backside of the first substrate, opposite the frontside of the first substrate, and having a pair of isolation segments, wherein the isolation segments adjoin and are respectively on opposite sides of the doped shield region;
forming a second frontside interconnect structure on a second substrate, wherein the second frontside interconnect structure comprises a second electronic component; and
bonding the second frontside interconnect structure to the backside of the first substrate so the doped shield region is vertically between the first and second electronic components and the first and second electronic components are laterally between the isolation segments.

8. The method according to claim 7, further comprising:
bonding a carrier substrate to the first frontside interconnect structure so the first frontside interconnect structure is between the carrier substrate and the first substrate; and
thinning the first substrate from the backside of the first substrate.

9. The method according to claim 7, further comprising:
forming a backside interconnect structure on the backside of the first substrate, wherein the backside interconnect structure comprises a shield wire completely covering the doped shield region and the first electronic component.

10. The method according to claim 9, further comprising:
forming a through substrate via (TSV) extending into the backside of the first substrate to an interconnect wire of the first frontside interconnect structure, wherein the forming of the backside interconnect structure comprises forming a backside via extending directly from the shield wire directly to the TSV.

11. The method according to claim 7, further comprising:
forming a first hybrid bond structure on the backside of the first substrate, wherein the first hybrid bond structure is electrically coupled to the first frontside interconnect structure; and
forming a second hybrid bond structure on the second frontside interconnect structure, wherein the second hybrid bond structure is electrically coupled to the second frontside interconnect structure, and wherein the bonding is performed by hybrid bonding and comprises bringing the first and second hybrid bond structures into direct contact with each other.

12. The method according to claim 1, wherein the first and second inductors are formed with the same top layout, wherein the shield wire has a pair of sidewall segments respectively on opposite sides of the shield wire, and wherein the first and second inductors are laterally between the sidewall segments after the bonding.

13. The method according to claim 7, wherein the isolation segments are formed extending completely through the first substrate.

14. A method for forming a semiconductor packaging device, the method comprising:
doping a portion of a first substrate to form a doped shield region;
forming a first frontside interconnect structure and a second frontside interconnect structure respectively on the first substrate and a second substrate, wherein each of the first and second frontside interconnect structures comprises a stack of wires and vias and an inductor in the stack, and wherein the inductor of the first frontside interconnect structure is formed overlying the doped shield region;
forming a backside interconnect structure on an opposite side of the first substrate as the first frontside interconnect structure and comprising a shield wire overlying the inductor of the first frontside interconnect structure; and
bonding the backside interconnect structure to the second frontside interconnect structure, such that the inductor of the second frontside interconnect structure is separated from the inductor of the first frontside interconnect structure by the doped shield region and the shield wire.

15. The method according to claim 14, further comprising:
forming a trench isolation structure extending completely through the first substrate, and extending laterally in a closed path along a boundary of the doped shield region, after the forming of the first frontside interconnect structure.

16. The method according to claim 15, further comprising:
forming a first via extending through the first substrate to the first frontside interconnect structure; and forming a second via on the first via, wherein the shield wire is formed electrically coupled to the first via by the second via.

17. The method according to claim 14, wherein the inductor of the first frontside interconnect structure and the inductor of the second frontside interconnect structure have the same top layout and are vertically aligned after the bonding.

18. The method according to claim 14, wherein the shield wire has a first sidewall and a second sidewall respectively on opposite sides of the shield wire, and wherein the inductor of the second frontside interconnect structure is laterally between the first and second sidewalls.

19. The method according to claim 14, further comprising:
forming a conductive structure comprising the shield wire and having a U-shaped profile, wherein the U-shaped profile extends through the first substrate and further wraps around the doped shield region from a first side of the doped shield region to a second side of the doped shield region opposite the first side.

20. The method according to claim 14, wherein the bonding is performed by hybrid bonding.

\* \* \* \* \*